(12) United States Patent  
Wang et al.

(10) Patent No.: US 11,894,341 B2  
(45) Date of Patent: *Feb. 6, 2024

(54) SEMICONDUCTOR PACKAGE WITH THROUGH VIAS AND STACKED REDISTRIBUTION LAYERS AND MANUFACTURING METHOD THEREOF

(71) Applicant: Taiwan Semiconductor Manufacturing Company, Ltd., Hsinchu (TW)

(72) Inventors: Tsung-Ding Wang, Tainan (TW); Yen-Fu Su, Hsinchu (TW); Hao-Cheng Hou, Hsinchu (TW); Jung-Wei Cheng, Hsinchu (TW); Chien-Hsun Lee, Hsin-chu County (TW); Hsin-Yu Pan, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 388 days.

This patent is subject to a terminal disclaimer.

(21) Appl. No.: 17/164,851

(22) Filed: Feb. 2, 2021

(65) Prior Publication Data

US 2021/0242172 A1 Aug. 5, 2021

Related U.S. Application Data

(63) Continuation-in-part of application No. 16/869,596, filed on May 8, 2020, now Pat. No. 11,270,921.

(Continued)

(51) Int. Cl.  
H01L 25/065 (2023.01)  
H01L 21/48 (2006.01)  
(Continued)

(52) U.S. Cl.  
CPC ...... H01L 25/0652 (2013.01); H01L 21/4853 (2013.01); H01L 21/4857 (2013.01);  
(Continued)

(58) Field of Classification Search  
CPC ............ H01L 25/0652; H01L 21/4853; H01L 21/4857; H01L 21/565; H01L 23/3128;  
(Continued)

(56) References Cited

U.S. PATENT DOCUMENTS 9,000,584 B2 4/2015 Lin et al.  
9,048,222 B2 6/2015 Hung et al.  
(Continued)

*Primary Examiner* — Herve-Louis Y Assouman  
(74) *Attorney, Agent, or Firm* — JCIPRNET

(57) ABSTRACT

A semiconductor package includes a semiconductor die, an encapsulant, a first and second dielectric layer, a through via, an extension pad, and a routing via. The semiconductor die includes a contact post. The first dielectric layer extends on the encapsulant. The through via extends through the first dielectric layer and has one end contacting the contact post. The extension pad is disposed on the first dielectric layer, contacting an opposite end of the through via with respect to the contact post. The extension pad has an elongated shape, a first end of the extension pad overlaps with the contact post and the through via, and a second end of the extension pad overlaps with the encapsulant. The second dielectric layer is disposed on the first dielectric layer and the extension pad. The routing via extends through the second dielectric layer to contact the second end of the extension pad.

20 Claims, 40 Drawing Sheets

Related U.S. Application Data

(60) Provisional application No. 63/073,460, filed on Sep. 2, 2020, provisional application No. 62/967,594, filed on Jan. 30, 2020.

(51) Int. Cl.
*H01L 21/56* (2006.01)
*H01L 23/31* (2006.01)
*H01L 23/538* (2006.01)
*H01L 25/00* (2006.01)
*H01L 23/498* (2006.01)
*H01L 23/00* (2006.01)
*H01L 21/683* (2006.01)

(52) U.S. Cl.
CPC ........ *H01L 21/565* (2013.01); *H01L 23/3128* (2013.01); *H01L 23/5383* (2013.01); *H01L 23/5386* (2013.01); *H01L 25/50* (2013.01); *H01L 2225/06513* (2013.01); *H01L 2225/06541* (2013.01); *H01L 2225/06586* (2013.01)

(58) Field of Classification Search
CPC . H01L 23/5383; H01L 23/5386; H01L 25/50; H01L 2225/06513; H01L 2225/06541; H01L 2225/06586; H01L 2224/16146; H01L 2924/181; H01L 23/49811; H01L 23/49838; H01L 23/49816; H01L 23/5385; H01L 25/18; H01L 2224/16145; H01L 2224/18; H01L 23/5389; H01L 24/02; H01L 24/19; H01L 25/03; H01L 2221/68345; H01L 2221/68359; H01L 2924/18161; H01L 21/6835
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,270,921 B2 * | 3/2022 | Hou ................ H01L 21/56 |
| 2019/0148340 A1 * | 5/2019 | Yu .................. H01L 25/50 257/737 |

* cited by examiner

the above-mentioned patent application is hereby incorporated by reference herein and made a part of this specification.

SEMICONDUCTOR PACKAGE WITH THROUGH VIAS AND STACKED REDISTRIBUTION LAYERS AND MANUFACTURING METHOD THEREOF

CROSS-REFERENCE TO RELATED APPLICATION

This application claims the priority benefit of U.S. provisional application Ser. No. 63/073,460, filed on Sep. 2, 2020, and is a continuation-in-part of U.S. non-provisional application Ser. No. 16/869,596 filed on May 8, 2020, which claims the priority benefit of U.S. provisional application Ser. No. 62/967,594, filed on Jan. 30, 2020. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, or high performance computing (HPC) applications are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
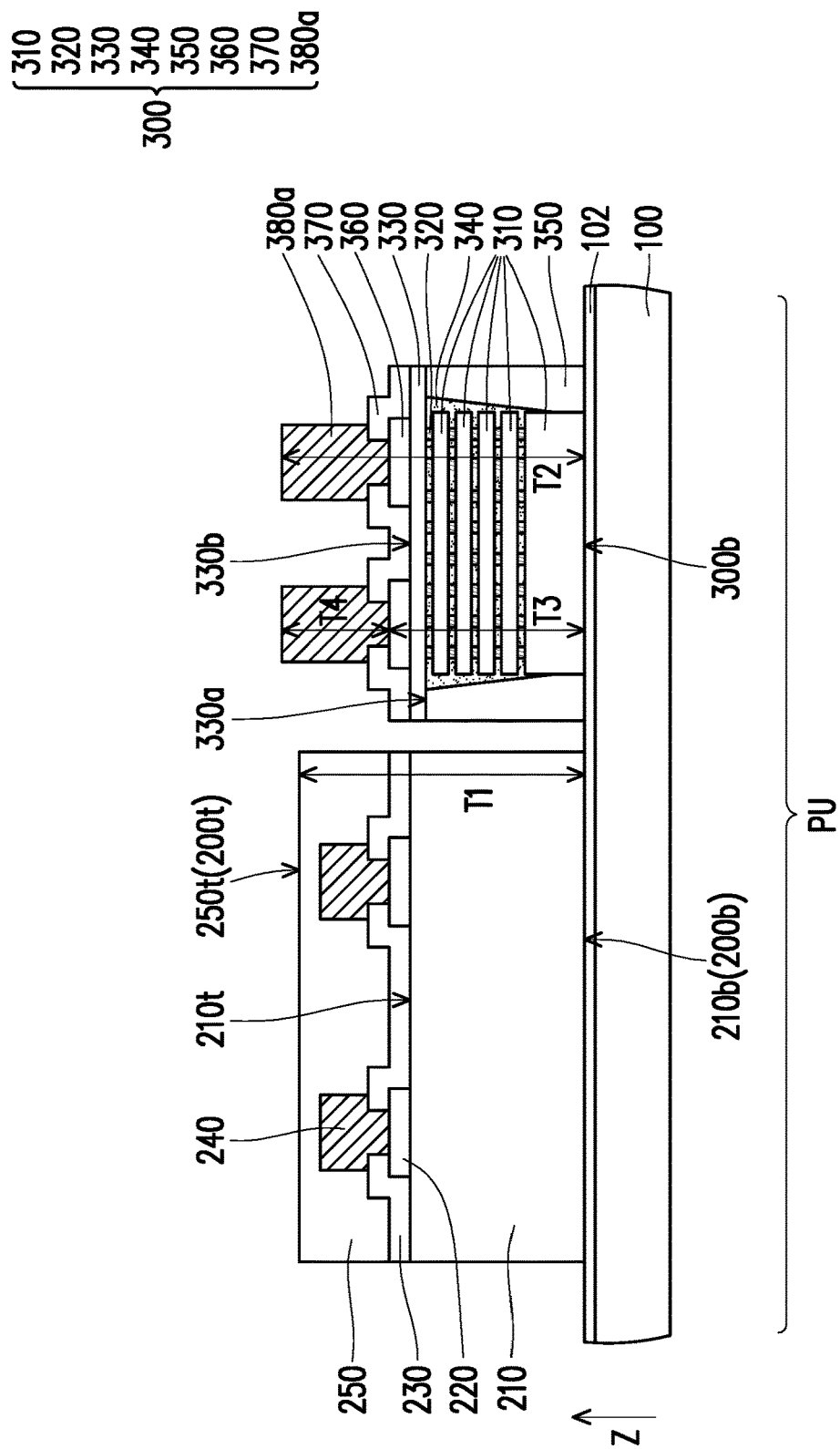
FIG. 1A to FIG. 1P are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
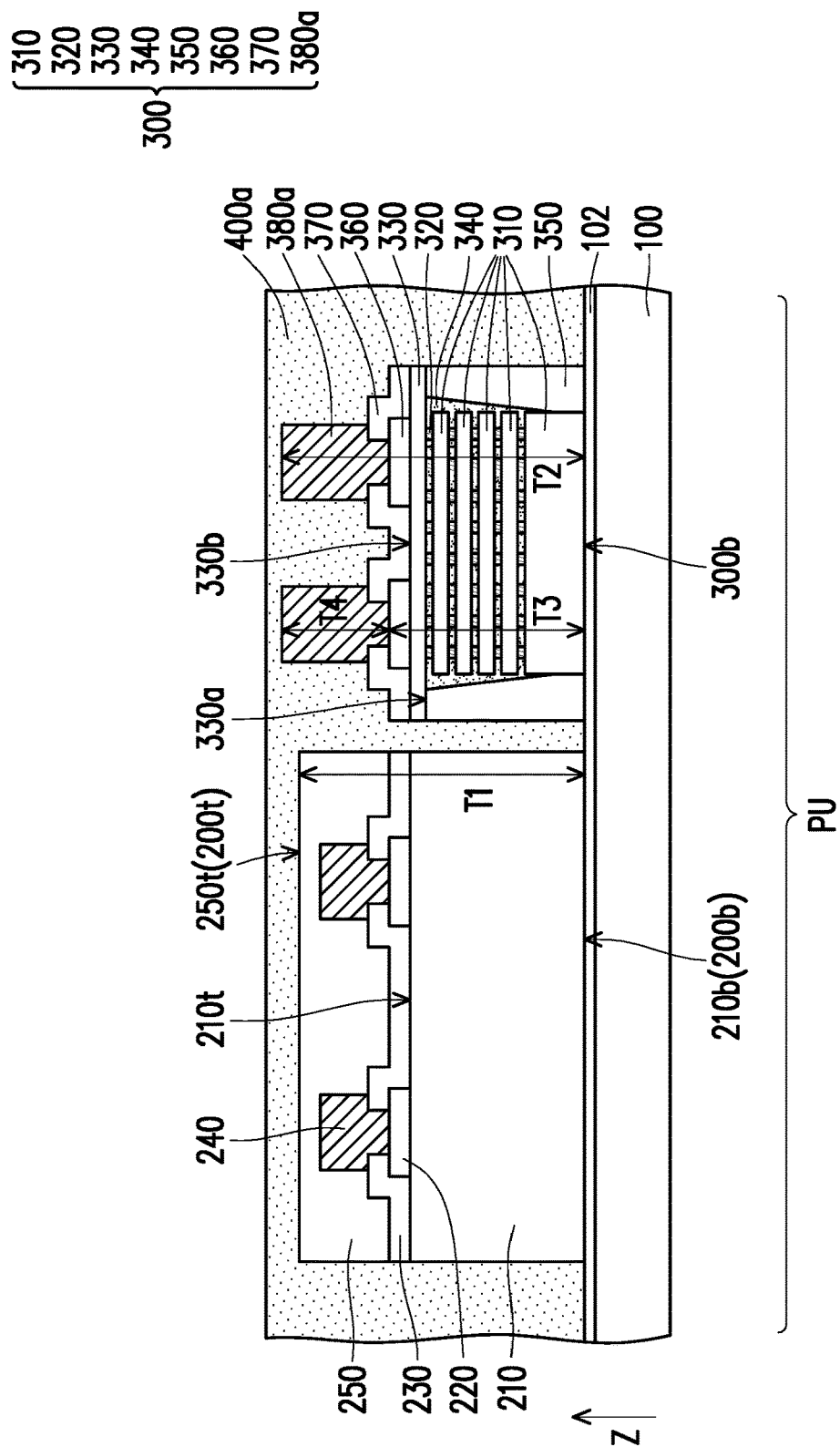
Figure 1C:
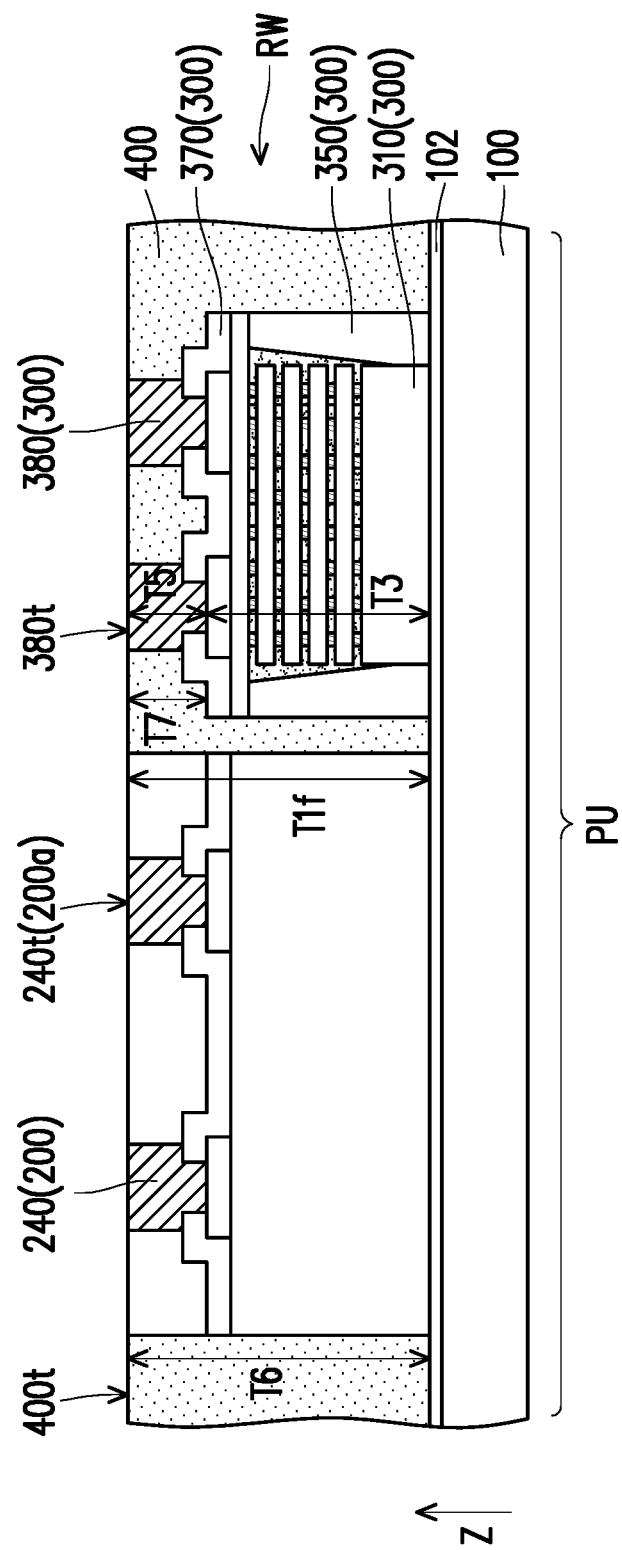
Figure 1D:
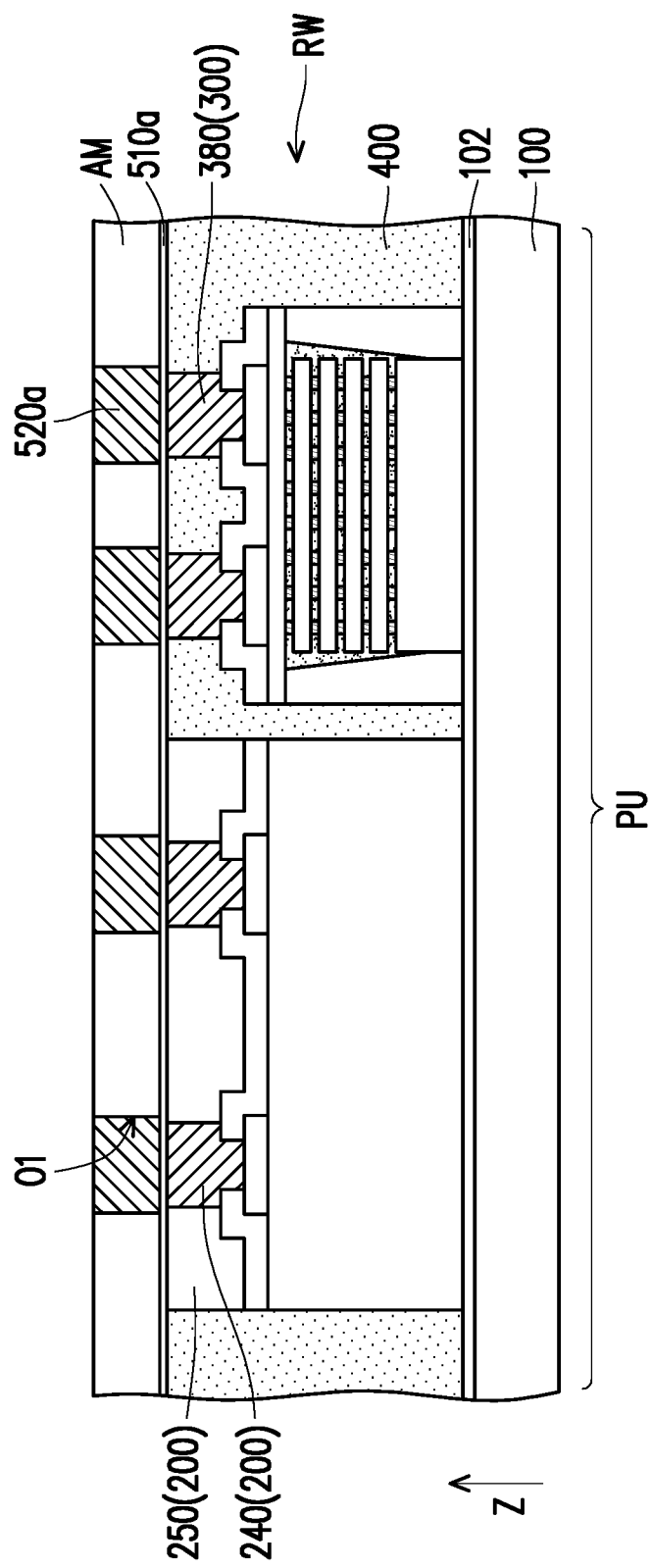
Figure 1E:
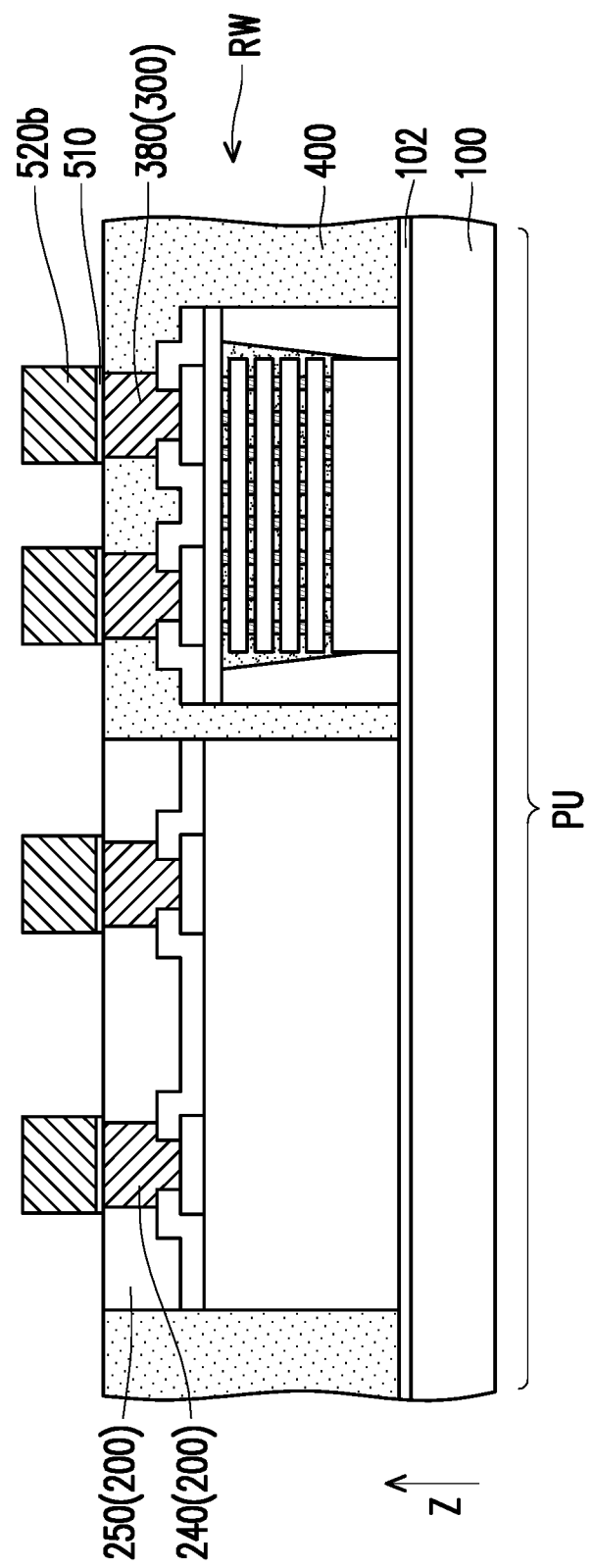
Figure 1F:
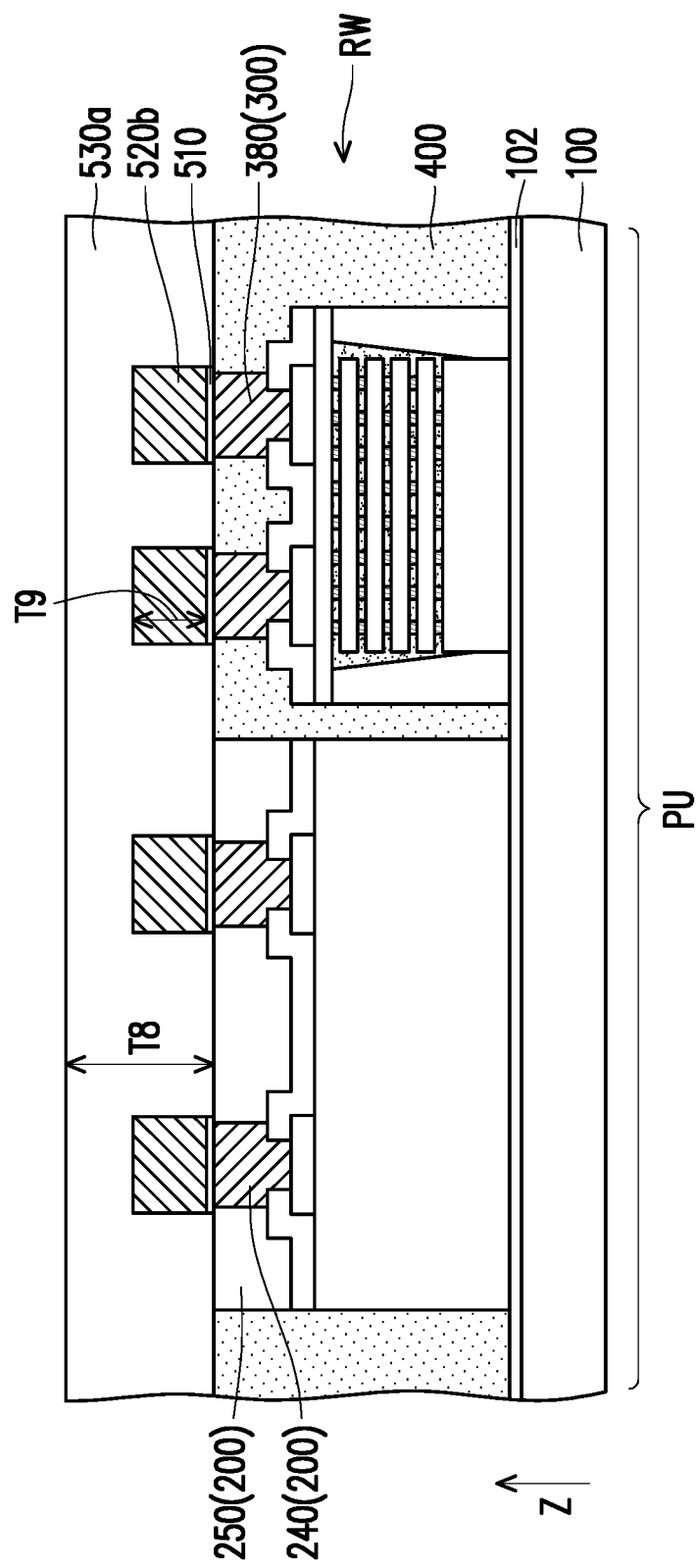
Figure 1G:
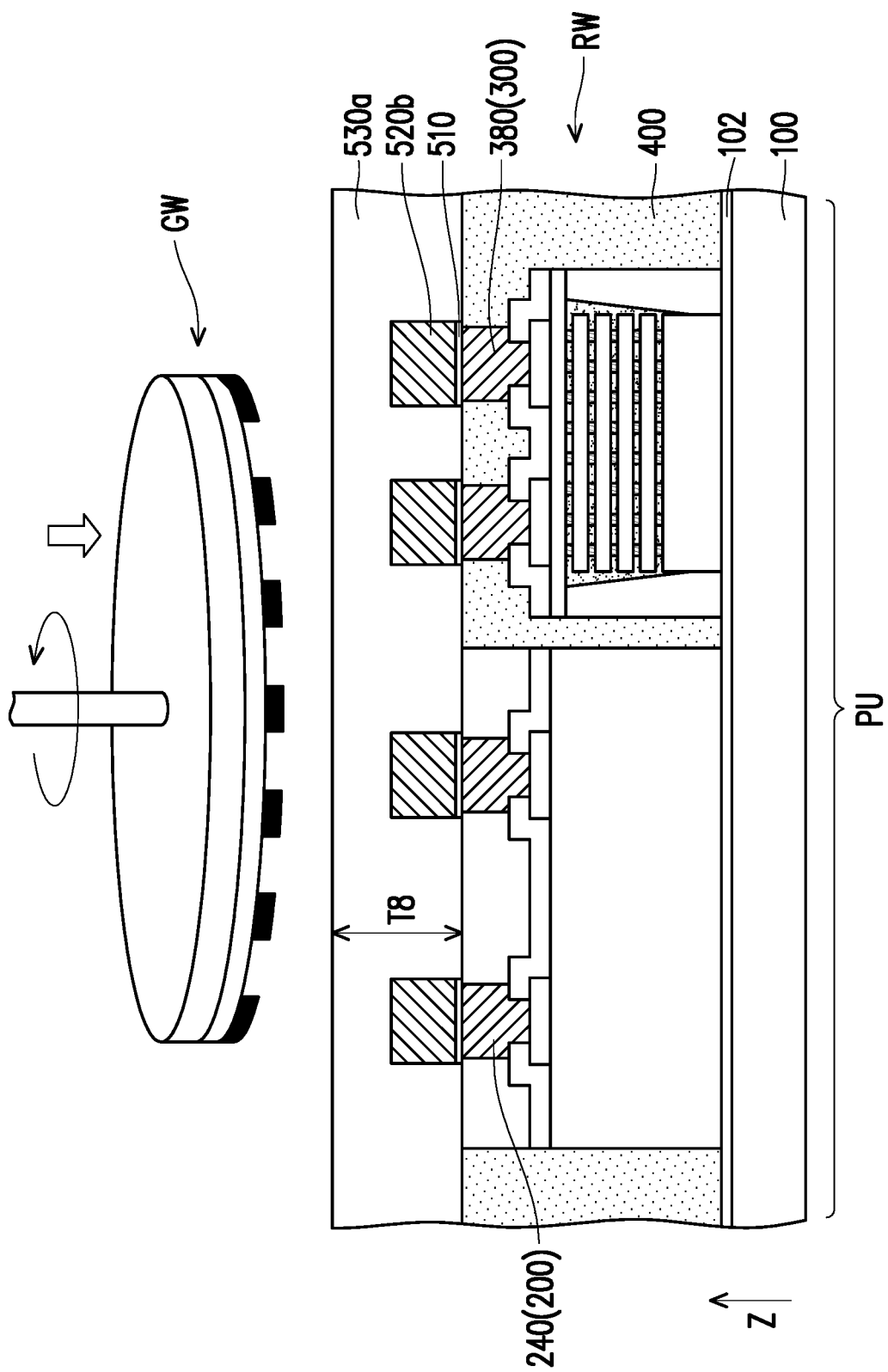
Figure 1H:
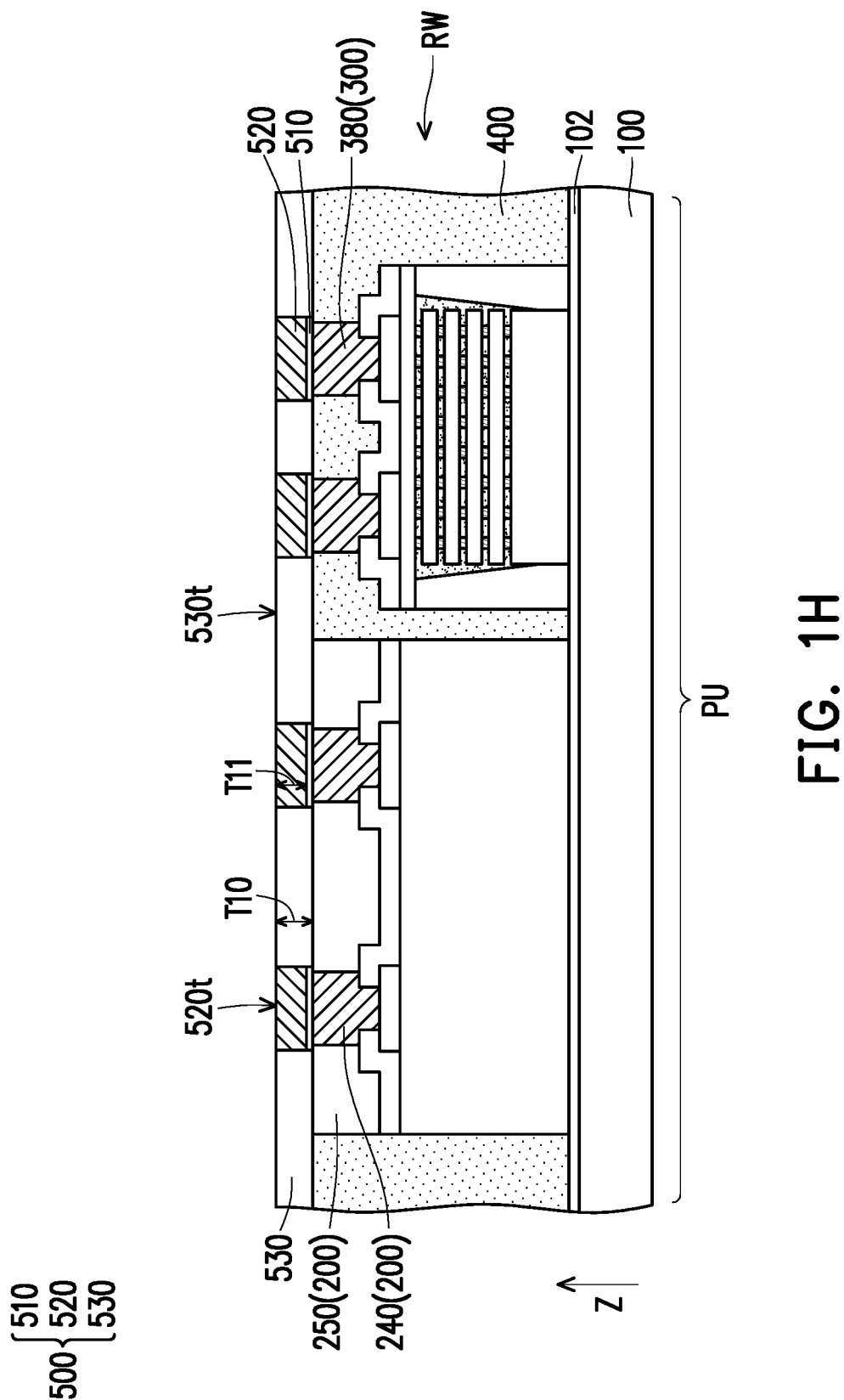
Figure 1I:
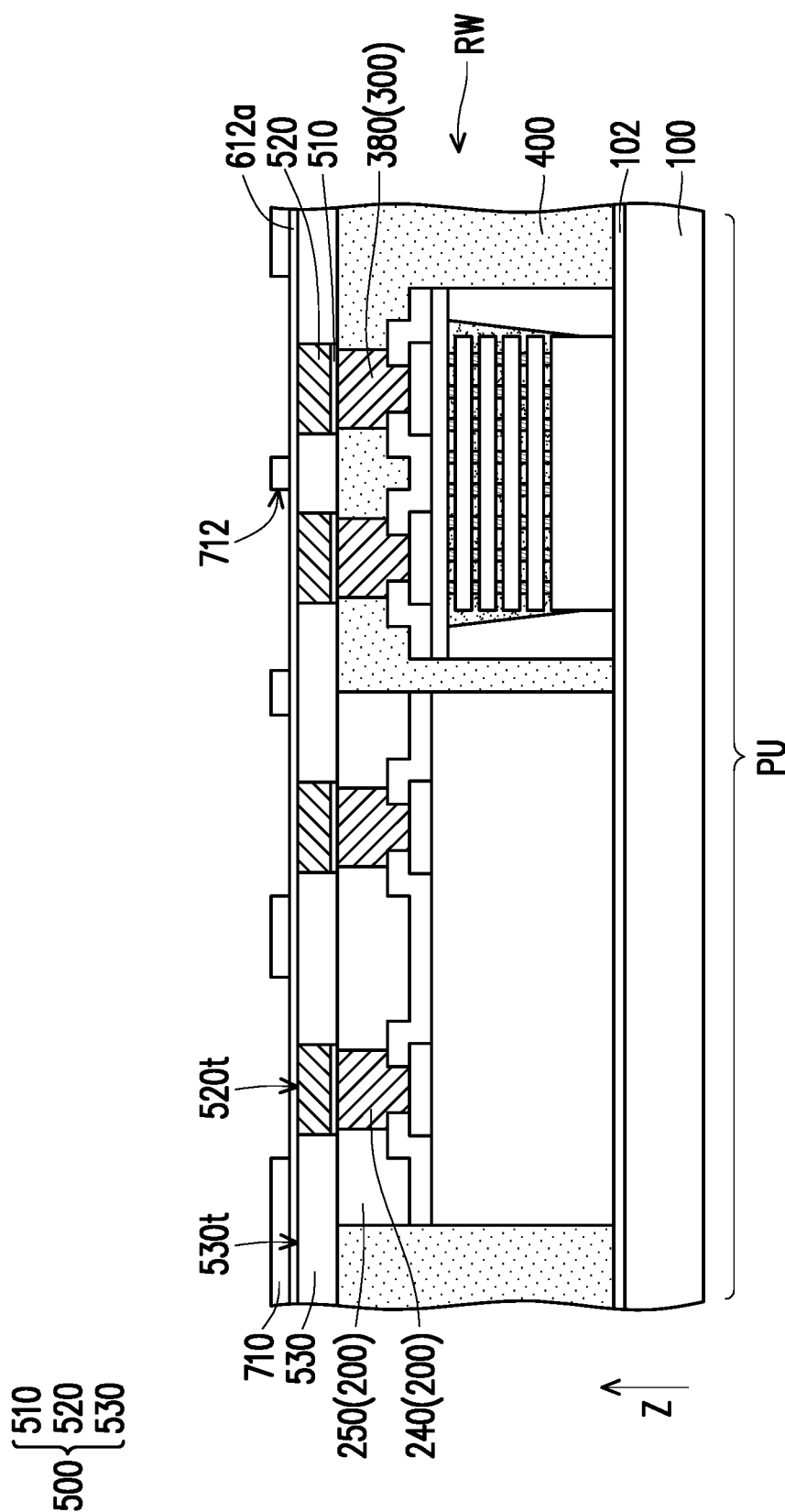
Figure 1J:
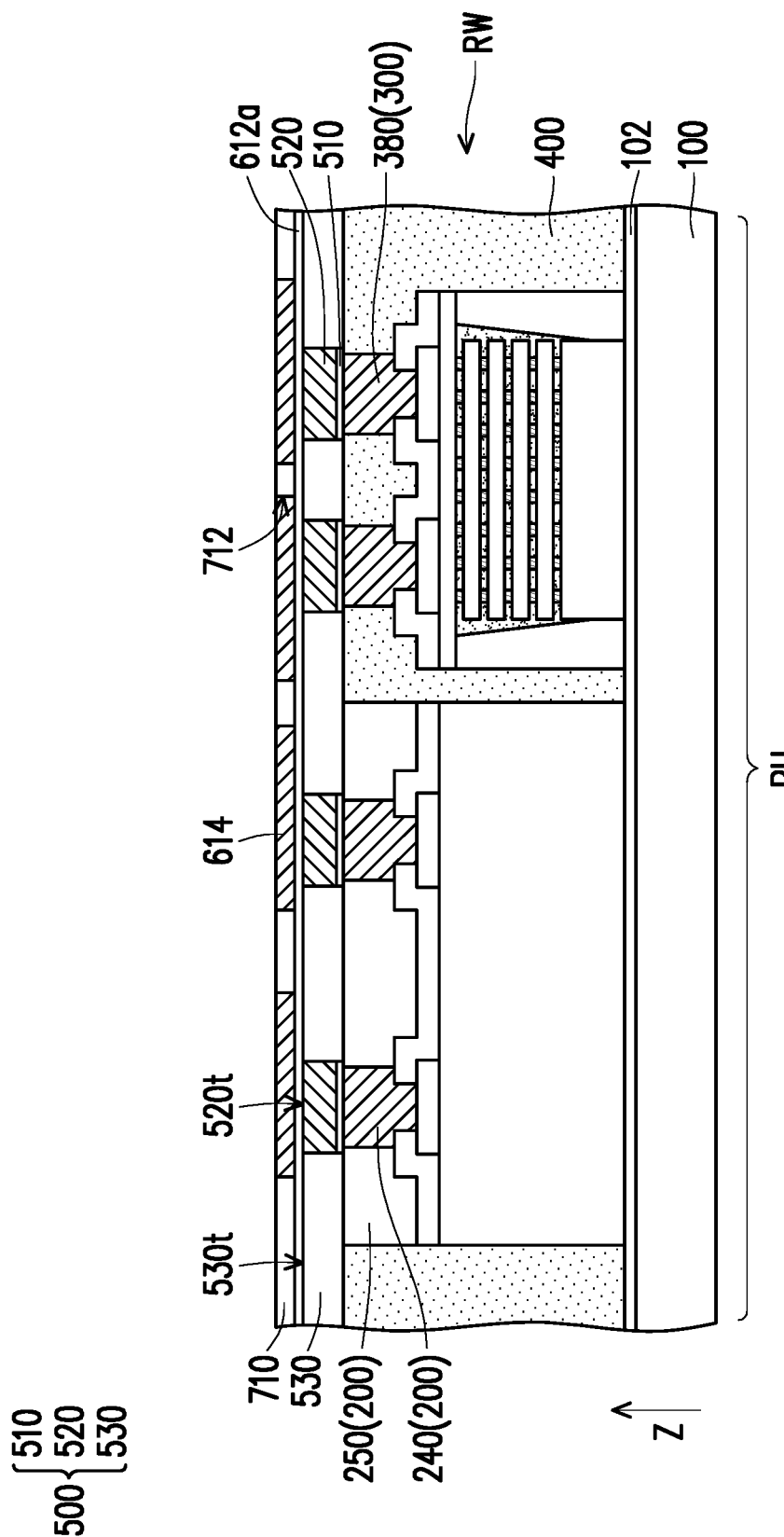
Figure 1K:
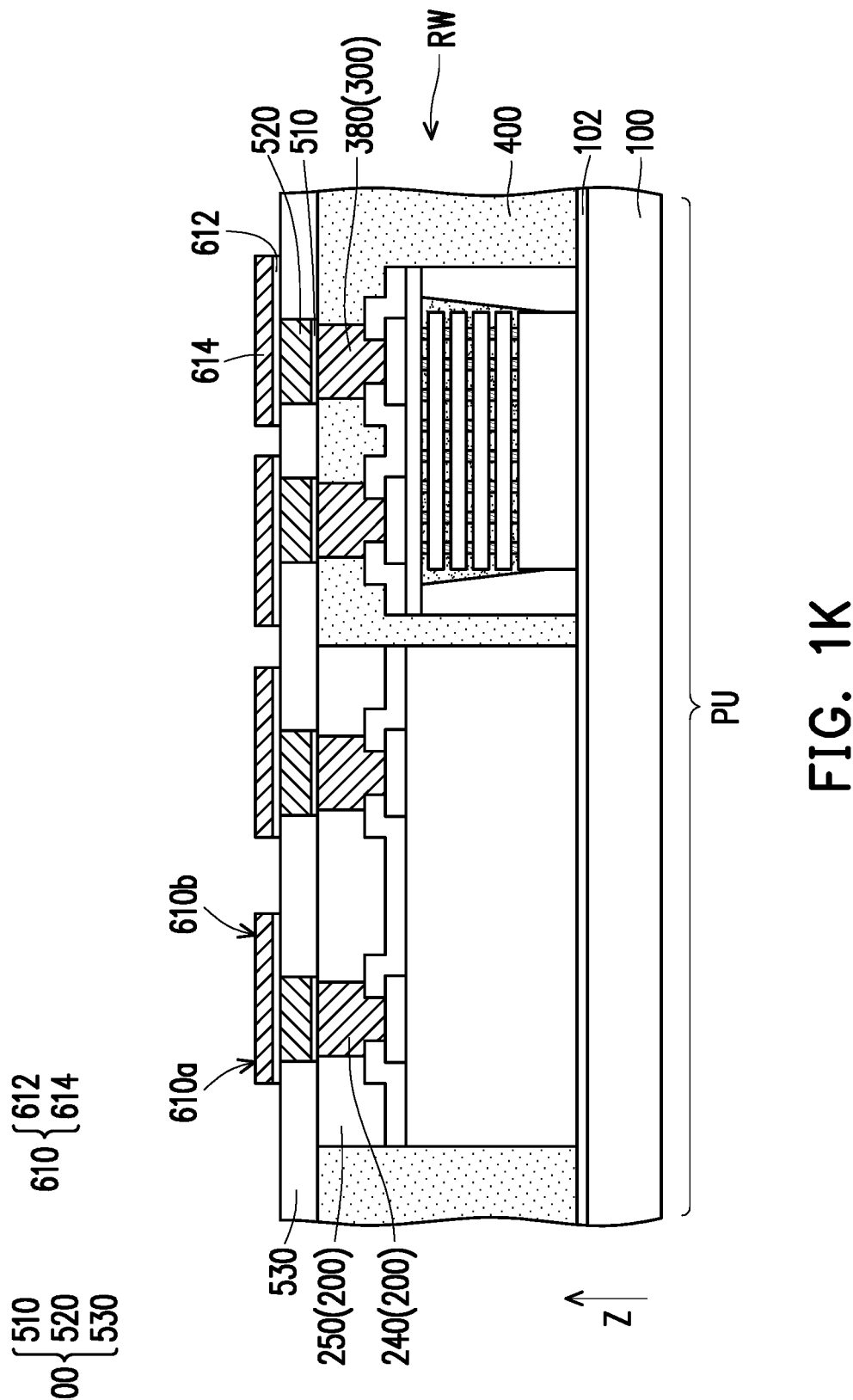
Figure 1L:
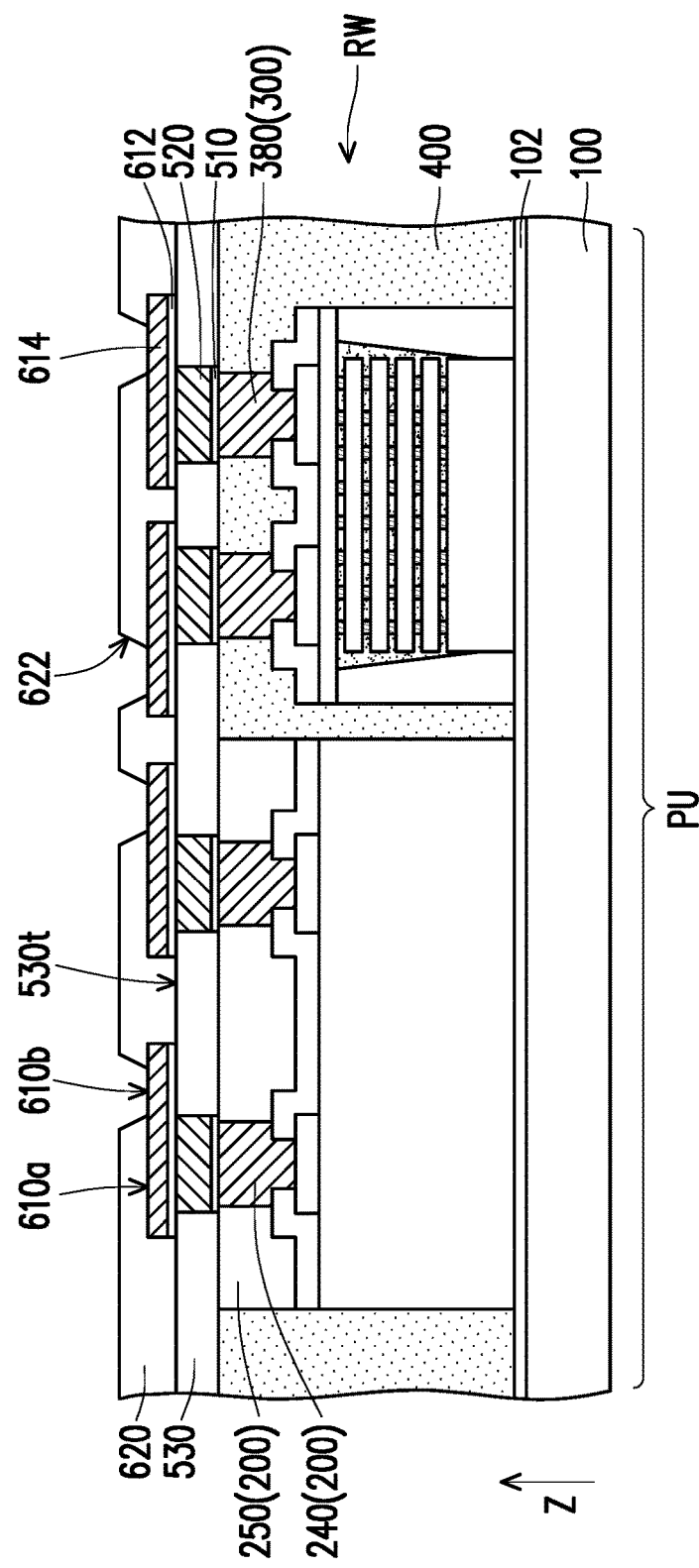
Figure 1M:
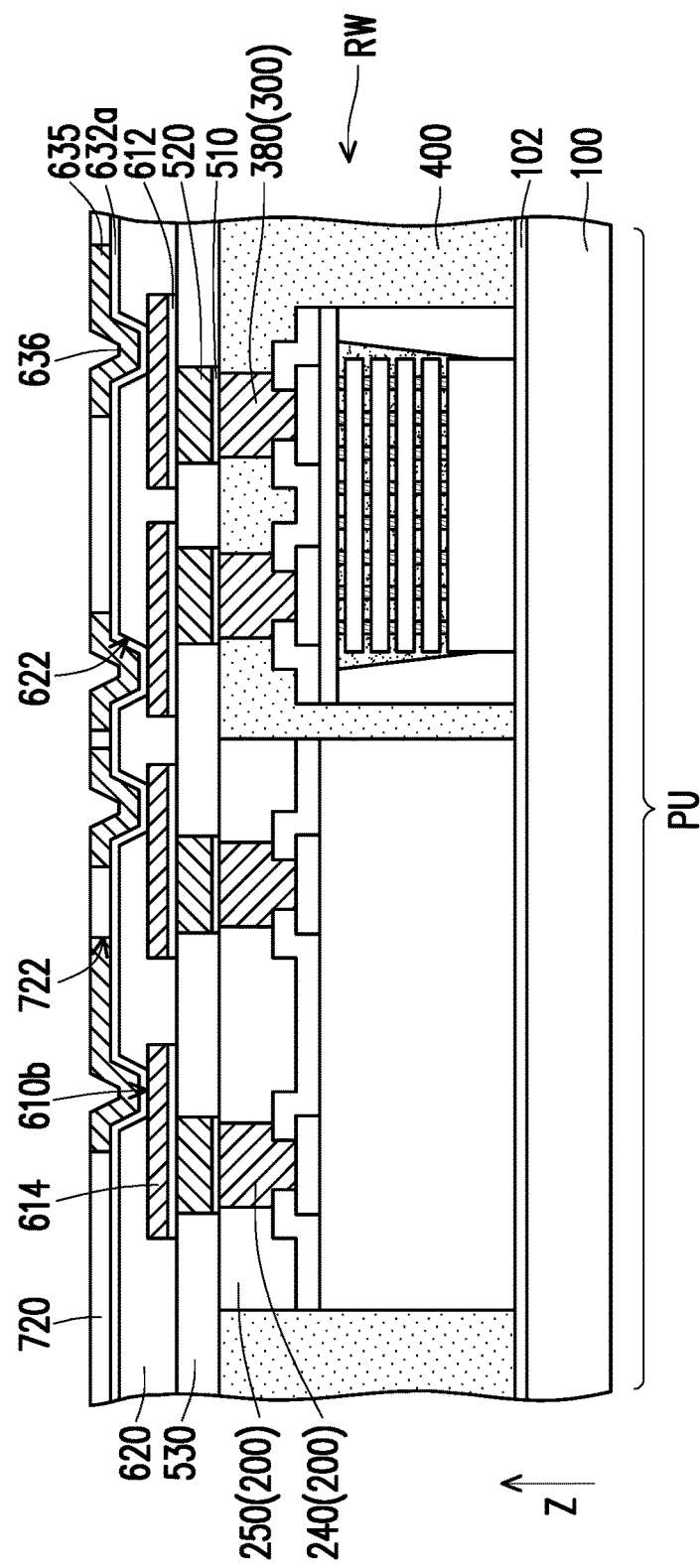
Figure 1N:
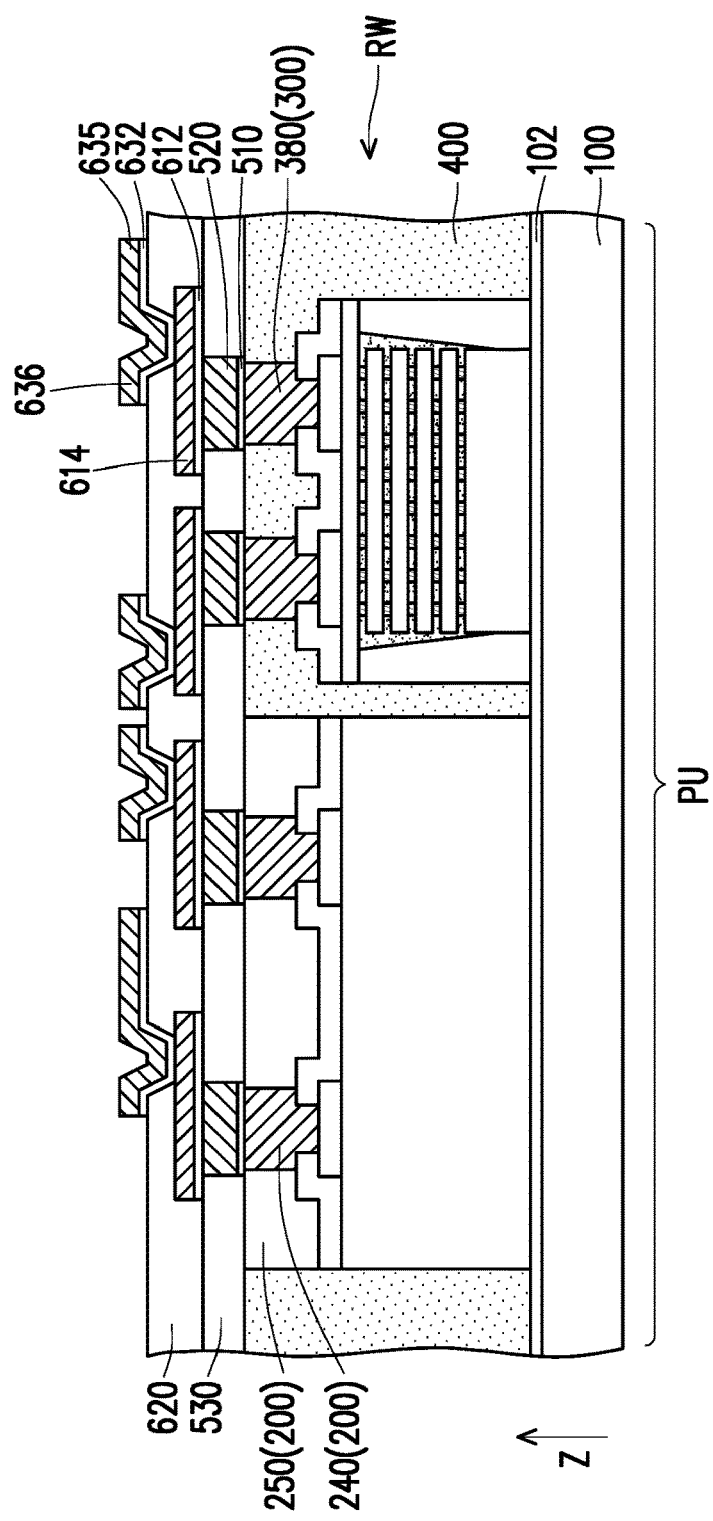
Figure 1P:
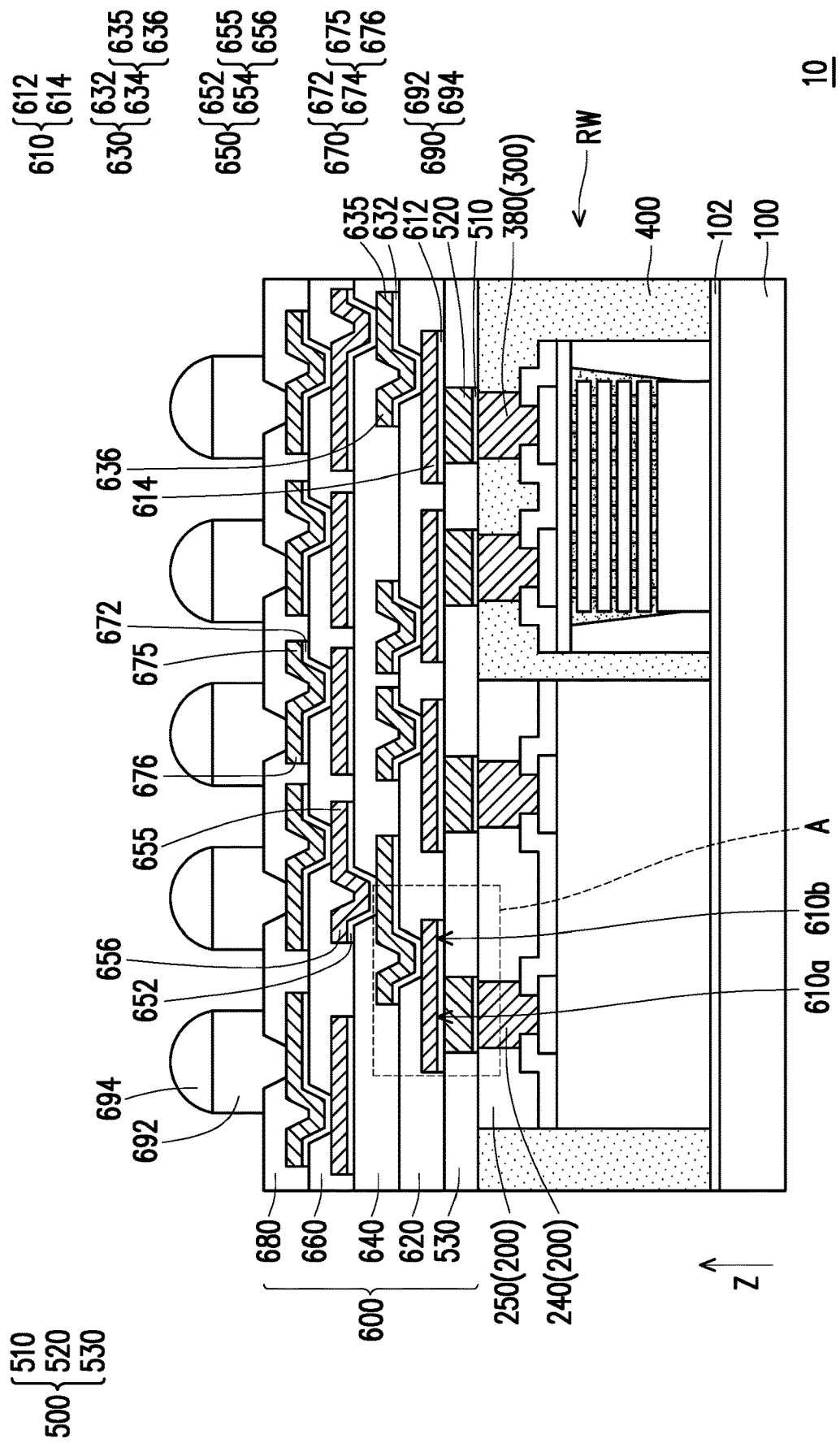

FIG. 1A to FIG. 1P are schematic cross-sectional views illustrating structures produced during a manufacturing process of a semiconductor package 10 in accordance with some embodiments of the disclosure. Referring to FIG. 1A, a carrier 100 is provided. In some embodiments, the carrier 100 is a glass substrate, a metal plate, a plastic supporting board or the like, but other suitable substrate materials may be used as long as the materials are able to withstand the subsequent steps of the process. In some embodiments, a de-bonding layer 102 is formed over the carrier 100. In some embodiments, the de-bonding layer 102 includes a light-to-heat conversion (LTHC) release layer, which facilitates peeling the carrier 100 away from the semiconductor package when required by the manufacturing process.

In some embodiments, referring to FIG. 1A, semiconductor dies 200, 300 are provided on the carrier 100. In some embodiments, the semiconductor dies 200, 300 are placed onto the carrier 100 through a pick-and-place method. Even though only two semiconductor dies 200, 300 are presented in FIG. 1A for illustrative purposes, it is understood that a semiconductor package according to some embodiments of the disclosure may contain more than two semiconductor dies 200, 300. Furthermore, a plurality of semiconductor dies 200, 300 may be provided on the carrier 100 to produce multiple package units PU with wafer-level packaging technology. Each of the semiconductor dies 200, 300 included in a package unit PU may independently be a bare die 200 or a packaged die 300, where the packaged die 300 may include one or more dies 310, 330 enclosed in an encapsulant 350 and/or having an encapsulant 350 formed thereon. For example, the packaged die 300 may be a die stack, as illustrated in FIG. 1A.

In some embodiments, a bare die 200 includes a semiconductor substrate 210, a plurality of contact pads 220, and a passivation layer 230. The contact pads 220 may be formed on a top surface 210t of the semiconductor substrate 210. The passivation layer 230 may cover the top surface 210t and have a plurality of openings that exposes at least a portion of each contact pad 220. A backside surface 210b of the semiconductor substrate 210 opposite to the top surface 210t may be referred to as the backside surface 200b of the bare die 200. In some embodiments, a bare die 200 further includes a plurality of contact posts 240 filling the openings of the passivation layer 230, thus establishing electrical connection to the contact pads 220. A protective layer 250 may surround the contact posts 240. In some embodiments, the contact posts 240 are initially covered by the protective layer 250, so that the top surface 250t of the protective layer 250 corresponds to the top surface 200t of the bare die 200. In some alternative embodiments, the contact posts 240 may be already exposed by the protective layer 250.

In some embodiments, the semiconductor substrate 210 may be made of semiconductor materials, such as semiconductor materials of the groups III-V of the periodic table. In some embodiments, the semiconductor substrate 210 includes elemental semiconductor materials, such as crystalline silicon, diamond, or germanium; compound semiconductor materials such as silicon carbide, gallium arsenic, indium arsenide, semiconductor oxides, or indium phosphide or alloy semiconductor materials such as silicon germanium, silicon germanium carbide, gallium arsenic phosphide, or gallium indium phosphide. In some embodiments, the semiconductor substrate 210 includes active components (e.g., transistors or the like) and optionally passive components (e.g., resistors, capacitors, inductors, or the like) formed therein.

In certain embodiments, the contact pads 220 include aluminum pads, copper pads, or other suitable metal pads. In some embodiments, the passivation layer 230 may be single-layered or multi-layered structures, including a silicon oxide layer, a silicon nitride layer, a silicon oxy-nitride layer, a dielectric layer formed by other suitable dielectric materials or combinations thereof. In some embodiments, the material of the contact posts 240 includes copper, copper alloys, or other conductive materials, and may be formed by deposition, plating, or other suitable techniques. In some embodiments, a material of the protective layer 250 may include a polymeric material, such as polyimide, acrylic resin, phenol resin, benzocyclobutene (BCB), polybenzoxazole (PBO), a combination thereof, or other suitable polymer-based dielectric materials. In some embodiments, the protective layer 250 may include one or more types of polyimides.

In some embodiment, a die stack may be included as the packaged die 300. In some embodiments, the packaged die 300 includes multiple stacked dies 310 electrically interconnected by micro-bumps 320. The dies 310 may have different thicknesses in the stacking direction (e.g., the vertical Z direction illustrated in FIG. 1A) with respect to each other, and may be stacked over a base die 330 having a larger footprint than the dies 310 in a plane perpendicular to the Z direction. The micro-bumps 320 electrically connect the dies 310 with each other and with the base die 330. An insulating material 340 may be optionally disposed in between the dies 310 surrounding the micro-bumps 320. The dies 310 may be encapsulated by an encapsulant 350. The encapsulant 350 may be located over the base die 330, on the side 330a of the base die 330 where the dies 310 are stacked. In some embodiments, the insulating material 340 may be omitted, and the encapsulant 350 may be disposed in between the dies 310 to surround the micro-bumps 320. Contact pads 360 are formed on the side 330b of the base die 330 opposite to the side 330a. Through semiconductor vias (not shown) may be formed in the base die 330 to electrically connect the contact pads 360 with the stacked dies 310. A passivation layer 370 may cover the side 330b of the base die 330, and at least partially cover the contact pads 360. The passivation layer 370 may include openings exposing portions of the contact pads 360. Contact posts 380 may be formed on the passivation layer 370, extending through the openings of the passivation layer 370 to establish electrical connection to the contact pads 360.

In some embodiments, the sizes of the bare dies 200 differ from the sizes of the packaged dies 300. For example, the thickness T1 of the bare die 200 illustrated in FIG. 1A may be smaller than the thickness T2 of the packaged die 300. The thickness T1 may be considered as the distance along the Z direction between the backside surface 200b and the top surface 200t of the bare die 200. At the manufacturing stage illustrated in FIG. 1A, the top surface 200t may be considered as the top surface 250t of the protective layer 250 (which, in some embodiments, covers the contact posts 240). The thickness T2 may be considered as the sum of the thickness T3 (the combined thickness of the interconnected stacked dies 310 with the intervening micro-bumps 320, the base die 330, and the contact pads 360) and the thickness T4 of the contact posts 380a. That is, in some embodiments, the contact posts 380a of the packaged die 300 may reach a level height along the Z direction higher than the level height of the top surface 200t of the bare die 200. In the disclosure, the individual thicknesses T1-T4 are not particularly limited.

Each one of the semiconductor dies 200, 300 may independently be or include a logic die, such as a central processing unit (CPU) die, a graphic processing unit (GPU) die, a micro control unit (MCU) die, an input-output (I/O) die, a baseband (BB) die, a field-programmable gate array (FPGA), an application processor (AP) die, or the like. In some embodiments, the semiconductor dies 200, 300 may also be or include memory dies, such as a high bandwidth memory die. For example, the memory die may be a dynamic random access memory (DRAM), a resistive random access memory (RRAM), a static random access memory (SRAM), or the like. In some embodiments, the semiconductor dies 200, 300 are the same type of dies or perform the same functions. In some embodiments, the semiconductor dies 200, 300 are different types of dies or perform different functions. The disclosure is not limited by the type of dies used for the semiconductor dies 200, 300 within a package unit PU. In some embodiments, a bare die 200 may be a system on chip type of die, including multiple devices formed in different regions of the semiconductor substrate 210. In some embodiments, a packaged die 300 may be a memory cube, for example, a high bandwidth memory die.

In some embodiments, the semiconductor dies 200, 300 are placed on the carrier 100 with the contact posts 240, 380a facing away from the carrier 100. Backside surfaces 200b, 300b of the semiconductor dies 200, 300 face the carrier 100. Portions of die attach film (not shown) may be disposed on the backside surfaces 200b, 300b, to secure the semiconductor dies 200, 300 to the carrier 100. In some embodiments, the die attach film includes a pressure adhesive, a thermally curable adhesive, or the like.

Referring to FIG. 1B, an encapsulating material 400a is formed over the carrier 100 to encapsulate the semiconductor dies 200, 300. In some embodiments, a material of the encapsulating material 400a includes a molding compound, a polymeric material, such as epoxy resin, acrylic resin, phenol resin, benzocyclobutene (BCB), polybenzoxazole (PBO), a combination thereof, or other suitable polymer-based dielectric materials. In some embodiments, the encapsulating material 400a further includes fillers, for example, inorganic fillers such as silica beads, metal oxides, ceramic particles or the like. In some embodiments, the encapsulant may include an epoxy resin in which the fillers are dispersed. The fillers may be used to tune the mechanical properties of the encapsulating material 400a, such as the elastic properties. In some embodiments, the Young's modulus of the encapsulating material 400a is in the range from 5 GPa to 30 GPa.

The encapsulating material 400a may be originally formed by a molding process (such as a compression molding process) or a spin-coating process so as to completely cover the semiconductor dies 200, 300. In some embodiments, referring to FIG. 1B and FIG. 1C, portions of the encapsulating material 400a are removed during a planarization process to form the encapsulant 400. The planarization process may include performing a mechanical grinding process and/or a chemical mechanical polishing (CMP) process. In some embodiments, the planarization process is performed until the contact posts 240, 380 of the semiconductor dies 200, 300 are exposed. In some embodiments, portions of the protective layer 250 and the contact posts 240, 380a may also be removed during the thinning or planarization process of the encapsulating material 400a. For example, the initial thickness T4 of the contact posts 380a may be reduced, resulting in contact posts 380 of thickness T5, where T5 is smaller than T4. Similarly, the initial thickness T1 of the bare die 200 may be reduced to a final thickness T1f. Following the planarization process, the top surfaces 240t of the contact posts 240 are exposed at the active surfaces 200a of the bare dies 200. The active surfaces 200a of the bare dies 200, the top surfaces 380t of the contact posts 380 of the packaged dies 300, and the top surface 400t of the encapsulant 400 may be substantially at a same level height along the Z direction (be substantially coplanar). In some embodiments, the direction Z is normal to the top surface 400t of the encapsulant 400. The thickness T6 of the encapsulant 400 on the carrier 100 or the debonding film 102 may be substantially equal to the final thickness T1f of the bare die 200. As illustrated in FIG. 1B, the portions of encapsulant 400 of thickness T6 laterally encapsulate the semiconductor dies 200, 300. In some embodiments, the encapsulant 400 also partially extends on top of the semiconductor dies 200, 300. For example, portions of encapsulant 400 may extend over the passivation layer 370 of the packaged die 300, thus wrapping the contact posts 380. The portions of encapsulant 400 extending on the semiconductor die 300 have a thickness T7 along the Z direction smaller than the thickness T6. That is, in some embodiments, the encapsulant 400 may partially cover the front surfaces of at least some of the packaged dies 300.

With the formation of the encapsulant 400, a reconstructed wafer RW is obtained. In some embodiments, the reconstructed wafer RW includes a plurality of package units PU. In other words, the exemplary process may be performed at a reconstructed wafer level, so that multiple package units PU are processed in the form of the reconstructed wafer RW. In the cross-sectional view of FIG. 1C, a single package unit PU is shown for simplicity but, of course, this is for illustrative purposes only, and the disclosure is not limited by the number of package units PU being produced in the reconstructed wafer RW.

In some embodiments, referring to FIG. 1D, a seed material layer 510a is provided over the semiconductor dies 200, 300, and the encapsulant 400. In some embodiments, the seed material layer 510a is blanketly formed over the package unit PU. In some embodiments, the seed material layer 510a establishes electrical contact to the contact posts 240 and 380 of the semiconductor dies 200 and 300, respectively. The seed material layer 510a may be formed through, for example, a sputtering process, a physical vapor deposition (PVD) process, or the like. In some embodiments, the seed material layer 510a may include, for example, copper, tantalum, titanium, a combination thereof, or other suitable materials. In some embodiments, a barrier layer (not shown) may be deposited before forming the seed material layer 510a to prevent out-diffusion of the material of the seed material layer 510a.

An auxiliary mask AM may be provided over the seed material layer 510a. In some embodiments, the auxiliary mask AM is patterned so as to cover only part of the seed material layer 510a. The auxiliary mask AM includes openings O1 through which portions of the seed material layer 510a are exposed. In some embodiments, the portions of seed material layer 510a exposed by the auxiliary mask AM lie over the contact posts 240, 380 of the semiconductor dies 200, 300. In some embodiments, the portions of seed material layer 510a exposed by the auxiliary mask AM further extends over the protective layer 250 of the bare die 200 and/or the encapsulant 400. In some embodiments, the auxiliary mask AM is produced by a sequence of deposition, photolithography, and etching. A material of the auxiliary mask AM may include a positive photoresist or a negative photoresist. In some embodiments, a conductive material 520a is formed over the seed material layer 510a in the openings O1. In some embodiments, the conductive material 520a may include copper, nickel, tin, palladium, gold, titanium, aluminum, tungsten, or alloys thereof. In some embodiments, the conductive material 520a may be formed by a plating process. The plating process is, for example, electro-plating, electroless-plating, immersion plating, or the like.

Referring to FIG. 1D and FIG. 1E, the auxiliary mask AM and the underlying portions of seed material layer 510a may be removed. In some embodiments, the auxiliary mask AM may be removed or stripped through, for example, etching, ashing, or other suitable removal processes. In some embodiments, the conductive material 520a formed in the openings O1 remains after removal of the auxiliary mask AM to form precursor through vias 520b. Upon removal of the auxiliary mask M1, the portions of seed material layer 510a that are not covered by the precursor through vias 520b are removed to render seed layers 510 disposed between the precursor through vias 520b and the contact posts 240, 380 of the semiconductor dies 200, 300. In some embodiments, the seed layers 510 further extend between the precursor through vias 520b and the protective layer 250 or the encapsulant 400. The exposed portions of the seed material layer 510a may be removed through an etching process. In some embodiments, the material of the precursor through vias 520b may be different from the material of the seed material layer 510a, so the portions of the seed material layer 510a exposed after removal of the auxiliary mask AM may be removed through selective etching. Upon removal of the auxiliary mask AM and the underlying portions of seed material layer 510a, portions of the encapsulant 400 and the protective layers 250 of the bare dies 200 may be exposed.

Referring to FIG. 1F, a high-modulus dielectric material layer 530a is provided on the package unit PU, extending on the encapsulant 400 and the protective layer 250 and embedding the precursor through vias 520b. In some embodiments, the thickness T8 of the high-modulus dielectric material layer 530a along the Z direction may be sufficient to completely cover the precursor through vias 520b. That is, the thickness T8 of the high-modulus dielectric material layer 530a may be greater than the thickness T9 of the precursor through vias 520b. A material of the high-modulus dielectric material layer 530a is not particularly limited, and may include molding compound, Ajinomoto build-up film, polymeric materials (e.g., polyimide, polyester, benzocyclobutene (BCB), polybenzoxazole, or the like), prepreg, resin coated copper (RCC), photo image dielectric (PID), phenolic paper, phenolic cotton paper, woven fiberglass cloth, impregnated woven fiberglass cloth, inorganic materials (e.g., ceramic materials), or a combination thereof. In some embodiments, the high-modulus dielectric material layer 530a includes an organic resin and inorganic fillers, such as glass beads. In some embodiments, the high-modulus dielectric material layer 530a may include a ceramic material, such as oxides. That is, the high-modulus dielectric material layer 530a may be a layer of ceramic material. When the high-modulus dielectric material layer 530a is a layer of ceramic material, it may be fabricated by physical vapor deposition (PVD), chemical vapor deposition (CVD), sintering of sprayed or coated ceramic glue, or the like. In some embodiments, the high-modulus dielectric material layer 530a may be a layer of a composite material. For example, the composite material may include molding compound or Ajinomoto build-up film mixed with fillers such as silica or glass beads. In some alternative embodiments, the composite material may include a polymer, such as polyimide or polybenzooxazole with a filler dispersed therein. The filler may be silica, glass, SiC particles, or carbon nanotubes, for example. In some embodiments, the high-modulus dielectric material layer 530a is laminated over the package unit PU. In some alternative embodiments, the high-modulus dielectric material layer 530a is formed by molding (e.g., compression molding) or other suitable deposition techniques. In some embodiments, the precursor through vias 520b are subjected to a micro-roughening treatment before providing the high-modulus dielectric material layer 530a, to enhance adhesion and decrease the occurrence of delamination.

Referring to FIG. 1F to FIG. 1H, in some embodiments the high-modulus dielectric material layer 530a may be thinned to form the high-modulus dielectric layer 530. Portions of the high-modulus dielectric material layer 530a may be removed, for example during a grinding process, to reduce the thickness T8 of the high-modulus dielectric material layer 530a to the thickness T10 of the high-modulus dielectric layer 530. In some embodiments, the thickness T10 may be in the range from 10 micrometers to 200 micrometers, for example in the range from 10 micrometers to 50 micrometers. In some embodiments, the thickness T10 is in the range from 20 micrometers to 100 micrometers, for example, in the range from 20 micrometers to 50 micrometers. In some embodiments, the thickness T10 is at least 10 micrometers, for example, about 25 micrometers. In some embodiments, the high-modulus dielectric material layer 530a may be thinned during a grinding process employing a grinding wheel GW. During grinding, the precursor through vias 520b may also be thinned from the original thickness T9 to the final thickness T11 to form the through vias 520. The final thickness T11 may be substantially equal to the thickness T10. That is, after grinding, the top surface 530t of the high-modulus dielectric layer 530 may be located substantially at the same level height along the Z direction as the top surfaces 520t of the through vias 520. In some embodiments, depending on the grinding conditions, the top surfaces 520t of the through vias 520 may slightly protrude over the top surface 530t of the high-modulus dielectric layer 530. In some embodiments, the high-modulus dielectric layer 530 and the through vias 520 with or without the seed layers 510 may be collectively referred to as buffer layer 500. In some embodiments, the Young's modulus of the high-modulus dielectric layer 530 may be in the range between 5 GPa and 25 GPa. In some embodiments, the high-modulus dielectric layer 530 may have a Young's modulus comparable to the one of the encapsulant 400. For example, the ratio of the Young's modulus of the high-modulus dielectric layer 530 to the Young's modulus of the encapsulant 400 may be in the range from 0.5 to 3. In some embodiments, the Young's modulus of the high-modulus dielectric layer 530 is higher than the Young's modulus of the protective layer 250 of the bare die 200. For example, the protective layer 250 may have a Young's modulus in the range of 2 to 4 GPa, and the ratio of the Young's modulus the high-modulus dielectric layer 530 to the Young's modulus of the protective layer 250 may be at least 1.5. Similarly, the encapsulant 400 may have a Young's modulus higher than the Young's modulus of the protective layer 250. In some embodiments the Young's modulus of the materials used may be isotropic.

In some embodiments, referring to FIG. 1I, a seed material layer 612a is formed over the buffer layer 500. The seed material layer 612a may blanketly cover the reconstructed wafer RW, and may be formed following similar processes and employing similar materials as previously described for the seed material layer 510a (illustrated, e.g., in FIG. 1D). An auxiliary mask 710 may be formed on the seed material layer 612a, with similar material and processes as previously described for the auxiliary mask AM of FIG. 1D. The auxiliary mask 710 is patterned to include openings 712 exposing portions of the seed material layer 612a. The openings 712 expose at their bottom portions of the seed material layer 612a extending on the through vias 520 and on the high-modulus dielectric layer 530 surrounding the through vias 520. That is, an opening 712 will expose a portion of the seed material layer 612a extending on one through via 520 and also on a portion of the high-modulus dielectric layer 530 adjacent the one through via 520.

In some embodiments, the openings 712 are filled with conductive material to form conductive pads 614, as illustrated, for example, in FIG. 1J. In some embodiments, the conductive material may include a metal material, such as copper, nickel, tin, palladium, gold, titanium, aluminum, tungsten, or alloys thereof. In some embodiments, the conductive pads 614 may be formed by a suitable deposition process, for example, a plating process. The plating process may be electro-plating, electroless-plating, immersion plating, or the like. In some embodiments, the conductive material may be formed so as to initially extend also on the auxiliary mask 710. A planarization process, (e.g., CMP or the like) may be performed to remove the excess of conductive material, exposing again the auxiliary mask 710 and leaving the conductive pads 614 filling the openings 712. In some embodiments, the auxiliary mask 710 and the underlying portions of the seed material layer 612a may be removed, for example via ashing, stripping, etching, or a combination thereof, leaving on the buffer layer 500 extension pads 610 including a seed layer 612 and a conductive pad 614 formed on the seed layer 612. In some embodiments, the extension pads 610 have an elongated shape, one end 610a of which extends on a through via 520 and the other end 610b of which extends on the high-modulus dielectric layer 530. In some embodiments, the end 610a may be the region of the extension pad 610 extending on the through via 520, while the end 610b extends on a region of the high-modulus dielectric layer 530 which lies on the encapsulant 400 or on the protective layer 250.

Referring to FIG. 1L, a dielectric layer 620 is formed on the buffer layer 500. The dielectric layer 620 covers the top surface 530t of the high-modulus dielectric layer 530 and at least partially covers the extension pads 610. In some embodiments, the dielectric layer 620 is patterned to include openings 622 exposing the ends 610b of the extension pads 610. That is, the dielectric layer 620 may cover the ends 610a of the extension pads 610 overlying the through vias 520 while revealing at the bottom of the openings 622 the ends 610b of the extension pads 610 overlying the high-modulus dielectric layer 530. In some embodiments, the high-modulus dielectric layer 530 and the dielectric layer 620 include different materials. In some embodiments, the material of the dielectric layer 620 includes polyimide, epoxy resin, acrylic resin, phenol resin, benzocyclobutene (BCB), polybenzooxazole (PBO), or any other suitable polymer-based dielectric material. In some embodiments, the dielectric layer 620 include polyimide. In some embodiments, a Young's modulus of the dielectric layer 620 is up to about 3 GPa, and is lower than the Young's modulus of the high-modulus dielectric layer 530. In some embodiments, a ratio of the Young's modulus of the high-modulus dielectric layer 530 to the Young's modulus of the dielectric layer 620 may be at least 1.5. For example, the ratio of the Young's modulus of the high-modulus dielectric layer 530 to the Young's modulus of the dielectric layer 620 may be around 2. The dielectric layer 620, for example, may be formed by suitable fabrication techniques such as spin-on coating, chemical vapor deposition (CVD), plasma-enhanced chemical vapor deposition (PECVD), or the like. In some embodiments, the dielectric layer 620 may be patterned to form the openings 622 via an etching step employing auxiliary masks (not shown).

In some embodiments, a seed material layer 632a is formed on the dielectric layer 620, as illustrated in FIG. 1M. The seed material layer 632a extends conformally on the dielectric layer 620, contacting the extension pads 610 at the bottom of the openings 622. The seed material layer 632a may be formed with similar material and processes as previously described for the seed material layer 510a (illustrated, e.g., in FIG. 1D). The auxiliary mask 720 is formed on the seed material layer 632a and includes openings 722 exposing portions of the seed material layer 632a. In some embodiments, the openings 722 overlie regions of the seed material layer 632a extending within the openings 622 and over the high-modulus dielectric layer 530. That is, the openings 722 may overlap with the end 610b of the extension pads 610 over the high-modulus dielectric layer 530, while a vertical projection of the span of the openings 722 may fall outside of the span of the through vias 520. In some alternative embodiments, there may be overlap between the span of the openings 722 and the span of the through vias 520. In some embodiments, the auxiliary mask 720 is formed with similar material and processes as previously described for the auxiliary mask AM (illustrated, e.g., in FIG. 1D).

In some embodiments, a conductive material is disposed in the openings 722 to form conductive traces 634. In some embodiments, the conductive traces 634 include routing lines 635 and routing vias 636. The routing lines 635 extend over the dielectric layer 620 and are connected at one end to the routing vias 636. The routing vias 636 extend within the openings 622 of the dielectric layer 620, to establish electrical connection between the extension pads 610 and the routing lines 635. In some embodiments, the routing vias 636 are formed along the sidewalls of the openings 622, and, depending on the size of the openings 622 may have a conformal shape with the openings 622 or may completely fill the openings 622. In some embodiments, a routing via 636 is connected to one routing line 635, and one routing line 635 is connected to at least one routing via 636. In some embodiments, the conductive traces 634 land on the ends 610b of the extension pads and have minimal overlap, if any, with the through vias 520. In some embodiments, the conductive material of the conductive traces 634 may include a metal material, such as copper, nickel, tin, palladium, gold, titanium, aluminum, tungsten, or alloys thereof. In some embodiments, the conductive traces 634 may be formed by a suitable deposition process, for example, a plating process. Referring to FIG. 1M and FIG. 1N, in some embodiments the auxiliary mask 720 and the underlying portions of seed material layer 632 are removed, for example via ashing, stripping, etching, or a combination thereof, leaving interconnection patterns 630 comprising seed layers 632 and the conductive traces 634 formed on the seed layers 632. Portions of the dielectric layer 620 overlying the through vias 520 may be once again exposed upon patterning of the seed material layer 632a.

Referring to FIG. 1O, a redistribution structure 600 is formed by providing additional dielectric layers 640, 660, 680 and interconnection patterns 650, 670, alternately stacked, following steps similar to the ones described above with reference to FIG. 1M and FIG. 1N. The interconnection patterns 650, 670 include seed layers 652 and 672 and conductive traces 654 and 674. The conductive traces 654 and 674 include routing lines 655, 675 and routing vias 656, 676. The dielectric layers 640 and 660 include openings exposing the corresponding underlying interconnection patterns 630 and 650. The routing vias 656, 676 of overlying interconnection patterns 650, 670 extend through the openings of the corresponding underlying dielectric layers 640, 660 to land on the routing lines 635, 655 of the underlying interconnection patterns 630, 650.

In some embodiments, the outermost dielectric layer 680 (the dielectric layer further away from the semiconductor dies 200, 300) includes openings exposing portions of the routing lines 675 of the outermost interconnection patterns 670. In some embodiments, connective terminals 690 are formed in the openings of the dielectric layer 680. The connective terminals 690 may include solder balls, ball grid array (BGA) connectors, metal pillars, controlled collapse chip connection (C4) bumps, bumps formed via electroless nickel-electroless palladium-immersion gold technique (ENEPIG), a combination thereof (e.g., a metal pillar with a solder ball attached), or the like. In some embodiments, the connective terminals 690 may include under-bump metallurgies 692 and solder caps 694. The under-bump metallurgies 692 may be conformally formed in the openings of the dielectric layer 680. In some embodiments, the under-bump metallurgies 692 may further extend over portions of the dielectric layer 680 surrounding the openings. In some embodiments, the under-bump metallurgies 692 may be multi-layered structures including different conductive materials. In some embodiments, a material of the under-bump metallurgies 692 includes copper, nickel, tin, palladium, gold, titanium, aluminum, or alloys thereof. In some embodiments, the solder caps 694 include eutectic solder. The solder may include lead, or may be lead-free. In some embodiments, the solder caps 694 include Sn, SnAg, SnPb, SnAgCu, SnAgZn, SnZn, SnBiIn, SnIn, SnAu, SnPb, SnCu, SnZnIn, SnAgSb, or similar soldering alloys. In some embodiments, the solder caps 694 include non-eutectic solder.

In some embodiments, referring to FIG. 1O and FIG. 1P, a singulation step is performed to separate the individual semiconductor packages 10, for example, by cutting through the reconstructed wafer RW along the scribe lanes SC arranged between individual package units PU. In some embodiments, adjacent semiconductor packages 10 may be separated by cutting through the scribe lanes SC of the reconstructed wafer RW. In some embodiments, the singulation process typically involves performing a wafer dicing process with a rotating blade and/or a laser beam. In some embodiments, the carrier 100 is separated from the semiconductor packages 10 following singulation. If the de-bonding layer 102 (e.g., the LTHC release layer) is included, the de-bonding layer 102 may be irradiated with a UV laser so that the carrier 100 and the de-bonding layer 102 are easily peeled off from the semiconductor packages 10. Nevertheless, the de-bonding process is not limited thereto, and other suitable de-bonding methods may be used in some alternative embodiments.

A cross-sectional view of a semiconductor package 10 according to some embodiments of the disclosure is illustrated in FIG. 1P. The semiconductor package 10 includes the semiconductor dies 200, 300 laterally wrapped by the encapsulant 400. Portions of the encapsulant 400 may extend over the semiconductor dies 200, 300, for example in between the packaged die 300 and the buffer layer 500. The buffer layer 500 is disposed on the encapsulated semiconductor dies 200, 300. In some embodiments, the buffer layer 500 may be considered an elevation tier of the redistribution structure 600, and the through vias 520 may be considered elevation vias of the redistribution structure 600. In some embodiments, by including an elevation tier in the redistribution structure 600, greater flexibility in the routing of the interconnection patterns 630, 650, 670 may be achieved. The redistribution structure 600 further includes extension pads 610 formed on the through vias 520 and on portions of the high-modulus dielectric layer 530 adjacent to the through vias 520. Dielectric layers 620, 640, 660, 680 and interconnection patterns 630, 650, 670 are alternately stacked on the buffer layer 500 and the extension pads 610, thus forming interconnection tiers of the redistribution structure 600. The routing lines 635, 655, 675 of the interconnection patterns 630, 650, 670 are sandwiched between adjacent dielectric layers 620, 640, 660, 680, and the routing vias 636, 656, 676 extend vertically through the dielectric layers 620, 640, 660, 680 to establish electrical connection between the routing lines 635, 655, 675 of different interconnection patterns 630, 650, 670 or between the routing lines 635, 655, 675 and the extension pads 610. That is, the extension pads 610 and the interconnection patterns 630, 650, 670 may establish electrical connection between the semiconductor dies 200, 300 and the redistribution connective terminals 690. In some embodiments, the routing vias 636 land on the ends 610b of the extension pads 610 extending on the high-modulus dielectric layer 530, without extending over the through vias 520 or the ends 610a of the extension pads 610. In some embodiments, by reducing the overlap between the bottommost routing vias 636 and the through vias 520, mechanical stress may be efficiently dissipated, reducing or preventing delamination between the conductive traces 634 and the surrounding dielectric layers (e.g., the dielectric layer 620 or 640). In some embodiments, the conductive traces 654, 674 of the upper interconnection patterns 650, 670 may overlap with the through vias 520, without significant penalty in terms of mechanical stability and reliability for the semiconductor package 10.

It should be noted that the disclosure is not limited by the number of interconnection patterns 630, 650, 670 and the number of the dielectric layers 620, 640, 660, 680 included in the redistribution structure 600. In some alternative embodiments, fewer or more interconnection patterns 630, 650, 670 and fewer or more dielectric layers 620, 640, 660, 680 than the ones illustrated in FIG. 1P may be formed depending on the circuit design.

Figure 2:
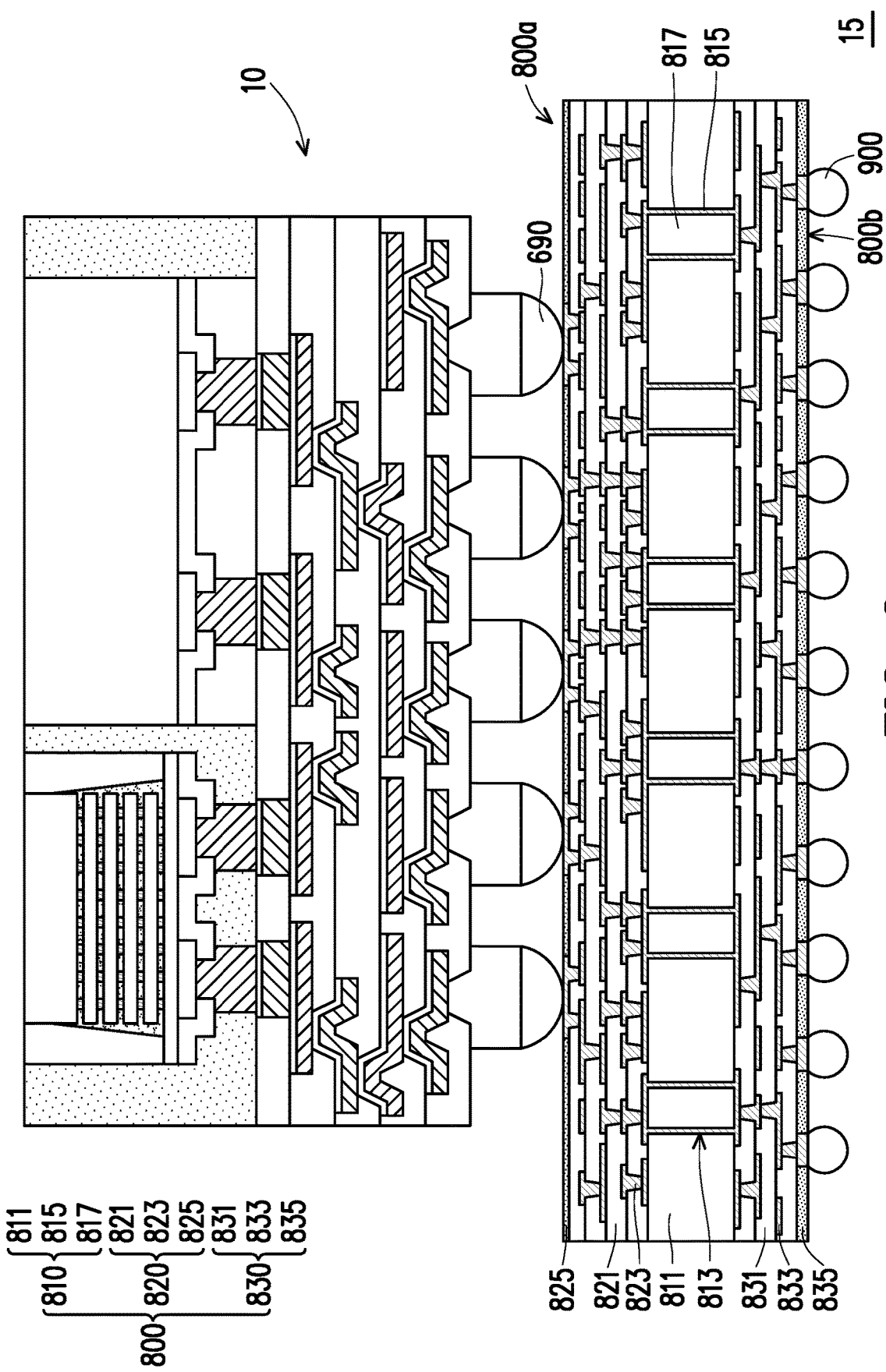
FIG. 2 is a schematic cross-sectional view illustrating a semiconductor package connected to a circuit substrate in accordance with some embodiments of the disclosure.

Referring to FIG. 2, in some embodiments, the semiconductor package 10 may be connected to a circuit substrate 800, such as a printed circuit board or the like, to be integrated within larger semiconductor devices 15. In some embodiments, the circuit substrate 800 includes a core layer 810 and build-up stacks 820, 830 disposed on opposite sides of the core layer 810. The core layer 810 may include a dielectric layer 811 including through holes 813 which cross the dielectric layer 811 from side to side. The through holes 813 may be lined with conductive material forming the through vias 815. In some embodiments, the through vias 815 only partially fill (e.g., line the edges of) the through holes 813, which are filled by a dielectric filling 817. In some alternative embodiments, the through holes 813 are filled by the through vias 815. In some embodiments, each build-up stack 820 or 830 respectively includes dielectric layers 821 or 831 and conductive patterns 823 or 833 embedded in the corresponding dielectric layer 821 or 831. The conductive patterns 823 or 833 and the through vias 815 may provide electrical connection between opposite sides of the circuit substrate 800. In some embodiments, the build-up stacks 820, 830 may independently include more or fewer dielectric layers 821, 831 and conductive patterns 823, 833 than what is illustrated in FIG. 2, according to the routing requirements. In some embodiments, the through vias 815 establish electrical connection between the conductive patterns 823 of one build-up stack 820 with the conductive patterns 833 of the other build-up stack 830. Patterned mask layers 825 and 835 may be optionally formed over the outermost dielectric layer 821 of the first build-up stack 820 and over the outermost dielectric layer 831 of the second build-up stack 830, respectively. The patterned mask layers 825, 835 may include openings exposing portions of the outermost conductive patterns 823, 833 of the respective build-up stacks 820 and 830. In some embodiments, a material of the patterned mask layers 825, 835 include polymeric materials, or other suitable insulating materials. In some embodiments, the material of the patterned mask layers 825, 835 includes silica, barium sulfate, epoxy resin, a combination thereof, or the like. The materials of the patterned mask layers 825, 835 serving as solder masks may be selected to withstand the temperatures of molten conductive materials (e.g., solders, metals, and/or metal alloys) used to connect the semiconductor package 10 or other devices (not shown) to the circuit substrate 800. In some embodiments, the patterned mask layer 825 includes different materials than the patterned mask layer 835. However, the disclosure is not limited by the structure of the circuit substrate 800, and circuit substrates with different structures with respect to the one illustrated in FIG. 2 may be used.

In some embodiments, the semiconductor package 10 is connected to the circuit substrate 800 from the side of the build-up stack 820 (e.g., the side 800a), while conductive terminals 900 are disposed at an opposite side 800b of the circuit substrate 800. In some embodiments, the connective terminals 690 of the semiconductor package 10 contact the conductive patterns 823 of the circuit substrate 800 to establish electrical connection. In some embodiments, an underfill (not shown) is optionally disposed between the semiconductor package 10 and the circuit substrate 800 to protect the connective terminals 690 from thermal and mechanical stresses. In some embodiments, the semiconductor package 10 may be soldered to the circuit substrate 800, during one or more heating steps. In some embodiments, the circuit substrate 800 and the semiconductor package 10, may have different coefficients of thermal expansion, which result in different thermal behaviors (e.g., amount of expansion) for the semiconductor package 10 and the circuit substrate 800 during the one or more heating steps. This difference in thermal behavior may produce mechanical stress at the level of the connective terminals 690 which may be transmitted through the redistribution structure 600 to the other components of the semiconductor package 10. In some embodiments, because the semiconductor package 10 includes the buffer layer 500 with the high-modulus dielectric layer 530, the mechanical stress may be effectively absorbed or dissipated by the buffer layer 500, protecting the integrity of the semiconductor package 10. In addition, by including the extension pads 610 in the redistribution structure 600 to reduce the overlap between the bottommost routing vias 636 and the through vias 520, the mechanical stress may be efficiently dissipated also at the level of the redistribution structure, thus reducing or preventing delamination between the conductive traces 634 and the surrounding dielectric layers (e.g., the dielectric layer 620 or 640). That is, inclusion of the high-modulus dielectric layer 530 and the extension pads 610 may help to effectively disperse the mechanical stress transmitted by the redistribution structure 600, possibly reducing the occurrence of cracking or delamination with respect to the case in which the high-modulus dielectric layer 530 and/or the extension pads 610 are not included. By avoiding direct physical contact between the material of the dielectric layers 620, 640, 660, 680 and the semiconductor dies 200, 300 or the encapsulant 400, the buffer layer 500 may effectively absorb or dissipate stresses transmitted through the redistribution structure 600 towards the other components of the semiconductor package 10. Therefore, the yield of the manufacturing process may increase, thus reducing unitary production costs, and the reliability and lifetime of the semiconductor package 10 and the semiconductor device 15 may also increase.

Figure 3A:
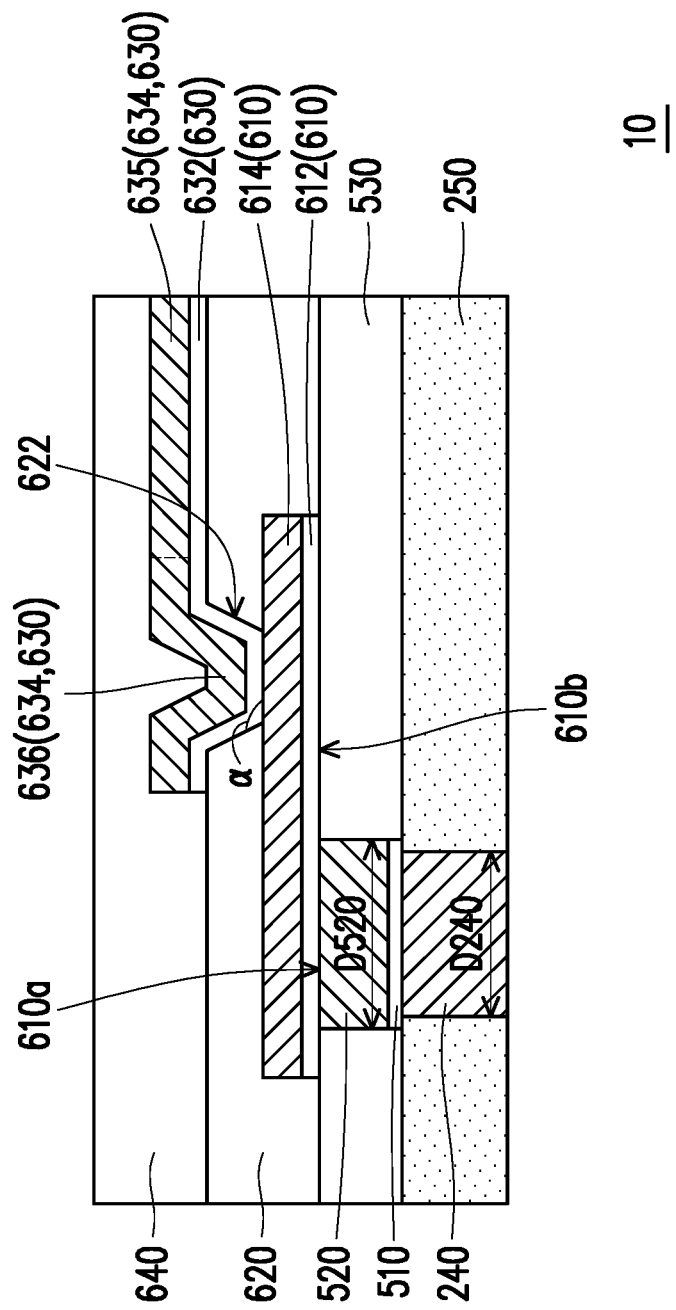
FIG. 3A is a schematic cross-sectional view of a portion of a semiconductor package in accordance with some embodiments of the disclosure.
Figure 3B:
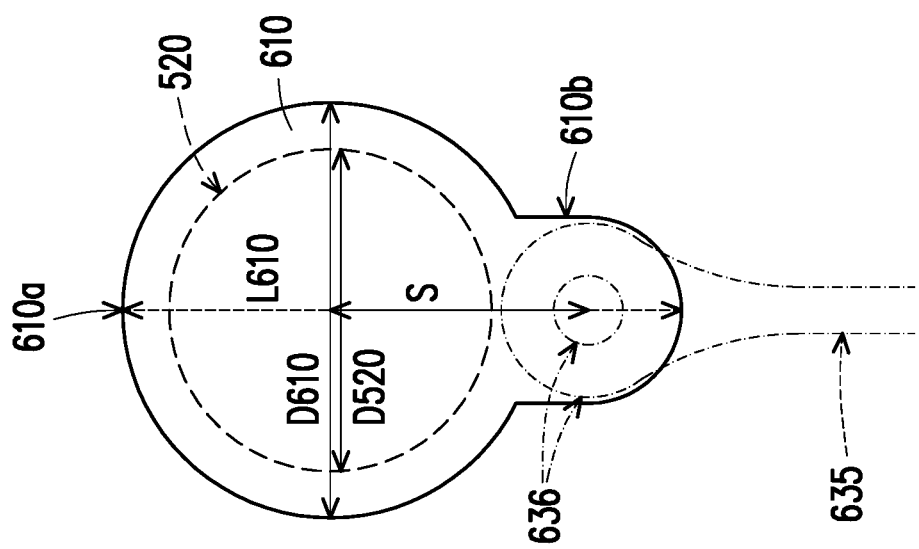
FIG. 3B is a schematic top view of the structure illustrated in FIG. 3A in accordance with some embodiments of the disclosure.
Figure 3B:
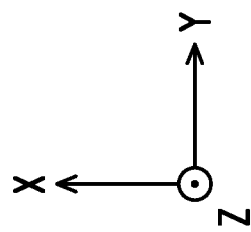

FIG. 3A is a schematic cross-sectional view of the region of the semiconductor package 10 encircled by the area A of FIG. 1P according to some embodiments of the disclosure. FIG. 3B is a schematic top view of the region illustrated in FIG. 3A according to some embodiments of the disclosure. In the top view of FIG. 3B, the span of the through via 520 underlying the extension pad 610 is illustrated as a dashed line, and the span of the illustrated region of the conductive trace 634 is illustrated by a dash-dotted line. The inner dash-dotted line represents the contact surface between the routing via 636 and the extension pad 610, while the outer dash-dotted line represents the portion of the conductive trace 634 extending on the dielectric layer 620 outside of the opening 622. In some embodiments, a ratio of the width D240 of the contact post 240 to the width D520 of the through via 520 may be in the range from 0.5 to 4. The widths D240 and D520 may be measured along a direction (e.g., the direction X) perpendicular to the vertical direction Z. Similar dimensional relationships may exist, however, along the direction Y, or along any other direction lying in the XZ plane. In some embodiments, similar relationships apply for the through vias 520 and the contact posts 380 of the packaged dies 300 (illustrated, e.g., in FIG. 1P). In some embodiments, the extension pad 610 has an elongated shape, with one end 610a extending on the through via 520 and the other end 610b extending away from the through via 520. In some embodiments, the end 620b may be considered a protrusion of the extension pad 610 with respect to the region including the end 610a. For example, when the through via 520 has a circular footprint, the end 610a may have the shape of a larger circle, from which the end 610b protrudes. In some embodiments, the end 610b may also have a circular shape of smaller diameter than the end 610a, and the extension pad 610 may have a shape resulting from the fusion of the two circles.

In some embodiments, if the width D520 is the largest dimension (e.g., diameter, diagonal and so on, depending on the footprint) of a through via 520 extending along a first direction, the largest dimension D610 of the extension pad 610 along the same direction may be 0.9 to 1.3 times the width D520 of the through via 520. In some embodiments, the end 610a of the extension pad 610 may entirely cover the through via 520. In some embodiments, the routing via 636 lands on the extension pad 610 in correspondence of the end 610b, in the region of the extension pad 610 not overlapping with the through via 520. In some embodiments, the size of the routing via 636 may increase moving away from the extension pad 610 in a vertical direction. That is, the size of the routing via 636 may be larger at the top of the dielectric layer 620 than at the bottom of the opening 622. Alternatively stated, the conductive trace 634 may have a tapered shape within the opening 622, with a tapering angle α measured between the sidewall of the conductive trace 634 within the opening 622 and the bottom surface of the conductive trace 634 in the range from 90 degrees to 110 degrees. For example, the tapering angle α may be greater than 90 degrees. In some embodiments, the region of the conductive trace 634 extending on the dielectric layer 620 may partially overlap with the through via 520, as long as the routing via 636 does not land on the through via 520. In some embodiments, by having the routing trace 636 landing on the extension pad 610 without overlapping with the through via 520, mechanical stress generated during bonding to a circuit substrate or the like may be efficiently dissipated. As illustrated in FIG. 3B, the routing line 635 departs from the routing via 636 extending on the dielectric layer 620. In some embodiments, a shift distance S between the through via 520 and the routing via 636 may be considered the distance in an XY plane between the center of the span of the through via 520 and the center of the span of contact surface of the routing via 636 with the extension pad 610. In some embodiments, the shift distance S may be selected as a function of the size of the through via 520. For example, a ratio between the shift distance S and the dimension D520 of the through via 520 may be in the range from 0.83 to 1.04. In some embodiments, the extension pad 610 may have a length L610 along the direction of the shift distance S. In some embodiments, the dimension D610 is taken along a direction orthogonal to the direction of the shift distance S. In some embodiments, an aspect ratio between the dimension D610 to the length L610 of the extension pad may be up to about 1.55.

Figure 4A:
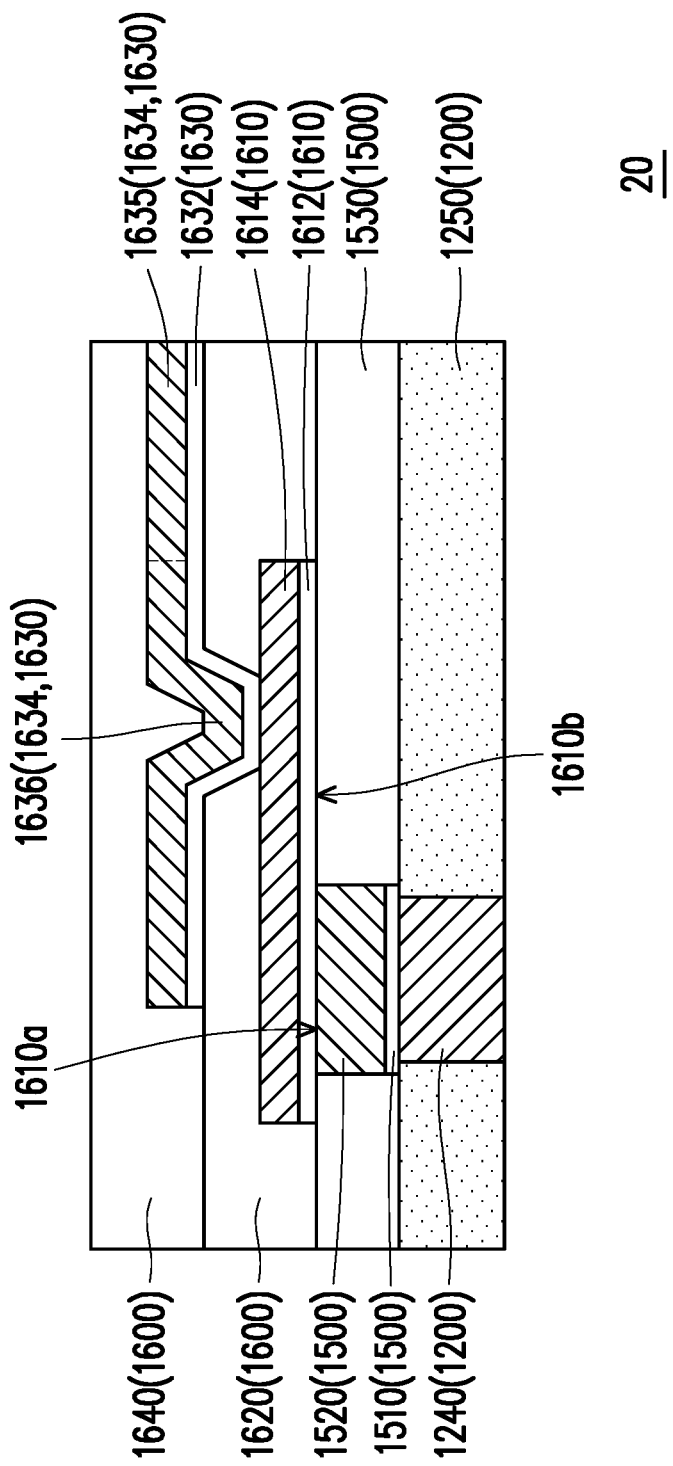
FIG. 4A is a schematic cross-sectional view of a portion of a semiconductor package in accordance with some embodiments of the disclosure.

FIG. 4A is a schematic cross-sectional view of a region of a semiconductor package 20 corresponding to the area A illustrated in FIG. 1P for the semiconductor package 10 according to some embodiments of the disclosure. The semiconductor package 20 may have a similar structure and be formed following a similar process as previously described for the semiconductor package 10. Briefly, the semiconductor package 20 also includes encapsulated semiconductor dies on which the buffer layer 1500 is formed, together with the extension pads 1610 and the dielectric layers (e.g., 1620, 1640) and interconnection patterns (e.g., 1630) of the redistribution structure 1600. The extension pads 1610 may include the seed layers 1612 and the conductive pads 1614, and have ends 1610a extending on the through vias 1520 and other ends 1610b extending on the high-modulus dielectric layer 1530. FIG. 4B is a schematic top view of the region illustrated in FIG. 4A according to some embodiments of the disclosure. In the top view of FIG. 4B, the span of the through via 1520 underlying the extension pad 1610 is illustrated as a dashed line, and the span of the illustrated region of the conductive trace 1634 is illustrated by a dash-dotted line. In some embodiments, a difference between the semiconductor package 10 and the semiconductor package 20 lies in that the conductive trace 1634 partially extends on the through via 1520. That is, while the routing via 1636 lands over a region of the extension pad 1610 overlying the dielectric layer 1530, the routing line 1535 extends on regions of the dielectric layer 1620 overlapping with the through via 1520.

Figure 4C:
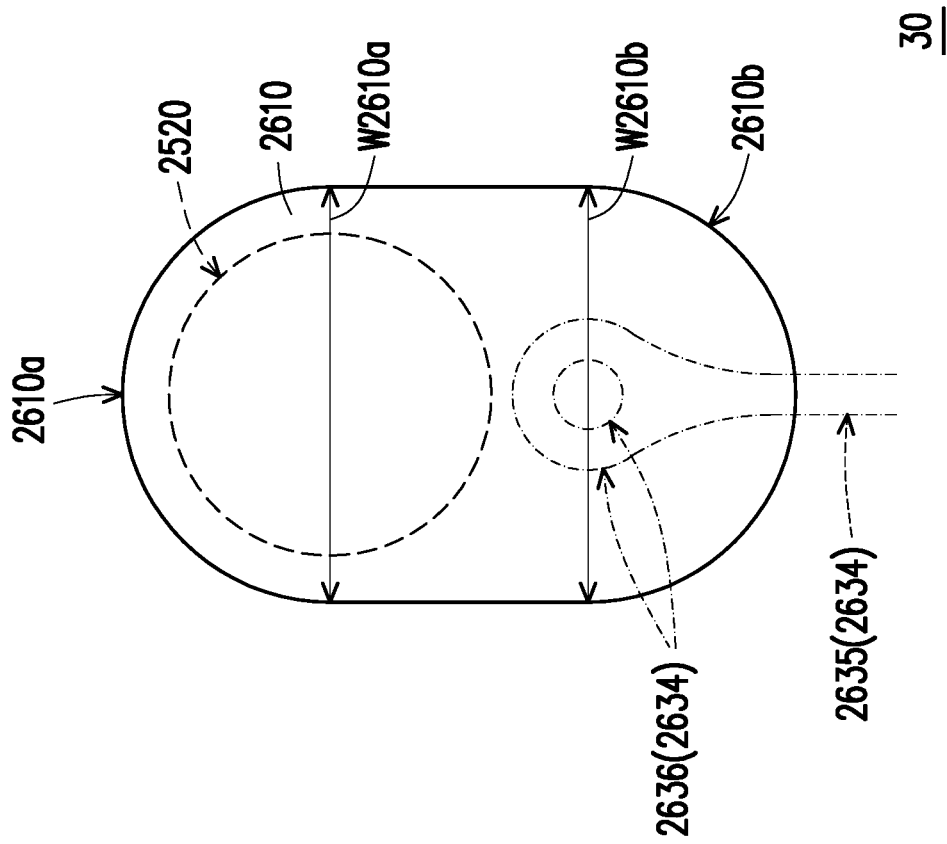
FIG. 4C is a schematic top view of the corresponding portion of a semiconductor package illustrated in FIG. 4A in accordance with some embodiments of the disclosure.
Figure 4B:
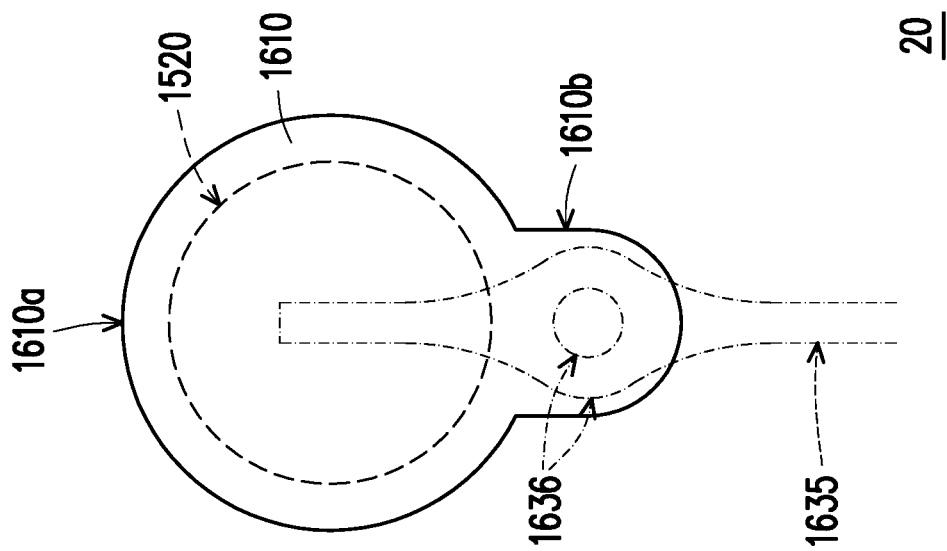
FIG. 4B is a schematic top view of the structure illustrated in FIG. 4A in accordance with some embodiments of the disclosure.

FIG. 4C is a schematic top view of a region of a semiconductor package 30 corresponding to the region illustrated in FIG. 4A for the semiconductor package 20. The semiconductor package 30 may have a similar structure and be formed following similar process as previously described for the semiconductor package 10 of FIG. 1P and the semiconductor package 20 of FIG. 4A. In the top view of FIG. 4C, the span of the through via 2520 underlying the extension pad 2610 is illustrated as a dashed line, and the span of the illustrated region of the conductive trace 2634 is illustrated by a dash-dotted line. In some embodiments, a difference between the semiconductor package 30 and the semiconductor package 10 of FIG. 3B lies in the shape of the extension pad 2610. That is, the width W2610b of the end 2610b of the extension pad 2610 on which the routing via 2636 lands may be comparable to the width W2610a of the end 2610a overlying the through via 2520. Similarly to what was previously described, the routing via 2636 is formed so as to land at a certain distance from the through via 2520.

Figure 5:
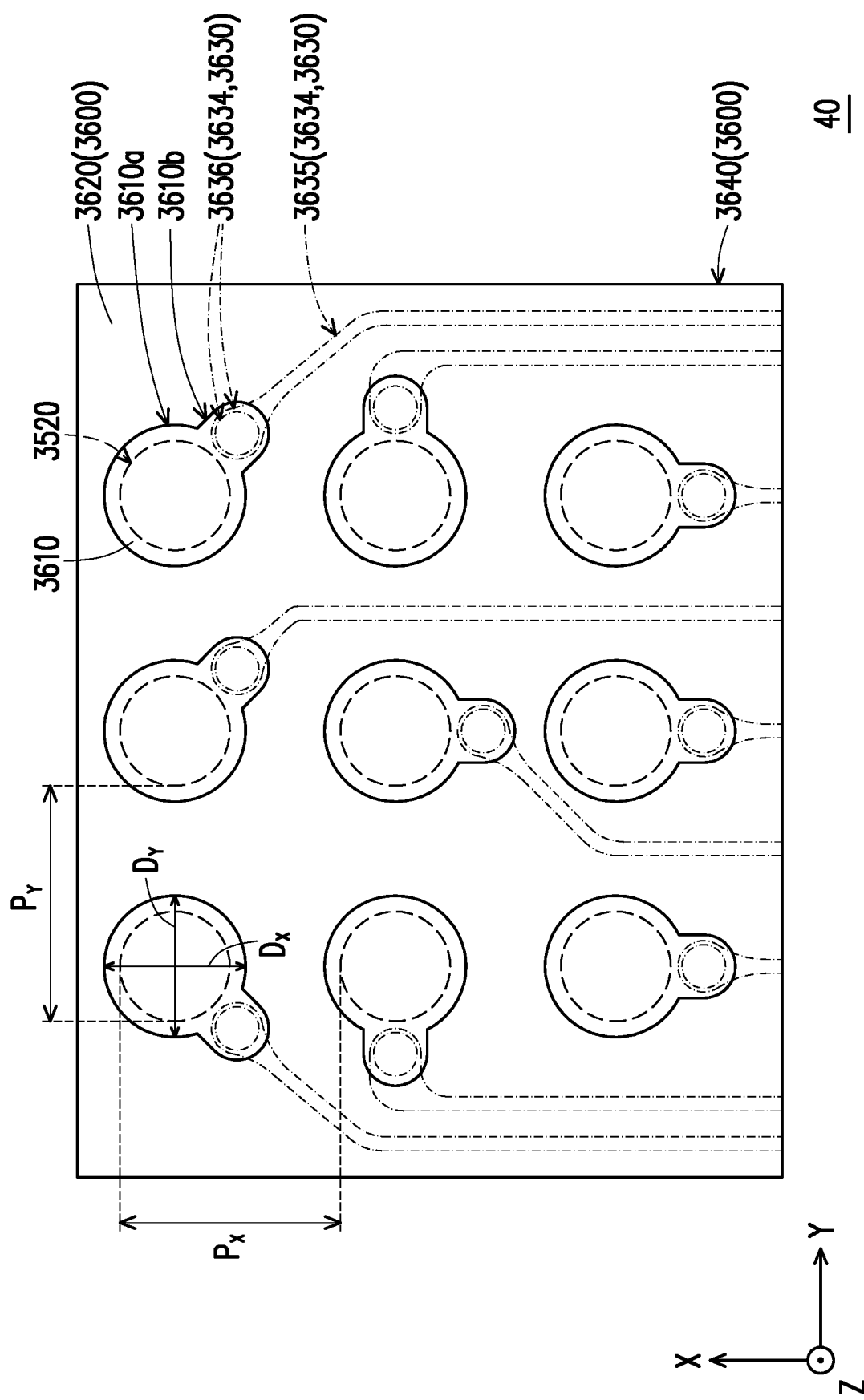
FIG. 5 is a schematic top view of a portion of a semiconductor package in accordance with some embodiments of the disclosure.

FIG. 5 is a schematic top view of a region of a semiconductor package 40 according to some embodiments of the disclosure. The semiconductor package 40 may have a similar structure and be fabricated following similar processes as previously described for the semiconductor package 10 of FIG. 1P, the semiconductor package 20 of FIG. 4A, and the semiconductor package 30 of FIG. 4C. In FIG. 5 are illustrated some aspects of the redistribution structure 3600. More specifically, in FIG. 5 are illustrated some aspects of the layout of the extension pads 3610 and the bottommost interconnection patterns 3630 of the semiconductor package 40 according to some embodiments of the disclosure. In the top view of FIG. 5, the spans of the through vias 3520 underlying the extension pad 3610 are illustrated as dashed lines, and the spans of conductive traces 3634 are illustrated by dash-dotted lines. In some embodiments, the through vias 3520 may be formed in an array manner, with certain pitches $P_X$ and $P_Y$ along the X and Y direction. In some embodiments, the extension pads 3610 may be considered to extend mostly on an XY plane, normal to the stacking direction Z of the dielectric layers (e.g., 3620, 3640) of the redistribution structure 3600. In some embodiments, the pitches $P_X$, $P_Y$ of the through vias 3520 and the dimensions DX, DY of the extension pads 3610 along the directions of the pitches PX, PY may be selected according to the required routing density. For example, the ratio of the dimension DX to the pitch PX and the ratio of the dimension PY to the pitch PY may independently be in the range from 0.2 to 0.8. In some embodiments, the extension pads 3610 may be freely oriented within the XY plane, for example to accommodate routing requirements. For example, when the extension pads 3610 include the narrower ends 3610b protruding from the wider ends 3610a, the narrower ends 3610b may extend along any suitable direction in the XY plane. In some embodiments, the routing line 3635 connected to a certain extension pad 3610 may be formed in such a manner that the associated routing via 3636 lands on the extension pad 3610 at a distance from the through vias 3520.

FIG. 6A to FIG. 6H are schematic cross-sectional views of structures formed during manufacturing of a redistribution structure 4600 according to some embodiments of the disclosure. In some embodiments, the redistribution structure 4600 may be included in any one of the semiconductor packages of the disclosure (e.g., in place of the redistribution structure 600 of the semiconductor package 10 of FIG. 1P). In some embodiments, the structure illustrated in FIG. 6A may be obtained from the structure illustrated in FIG. 1J by removing the auxiliary mask 710, for example via ashing or stripping. Upon removal of the auxiliary mask 710, the conductive pads 4614 remains on the seed material layer 4612a.

Figure 6A:
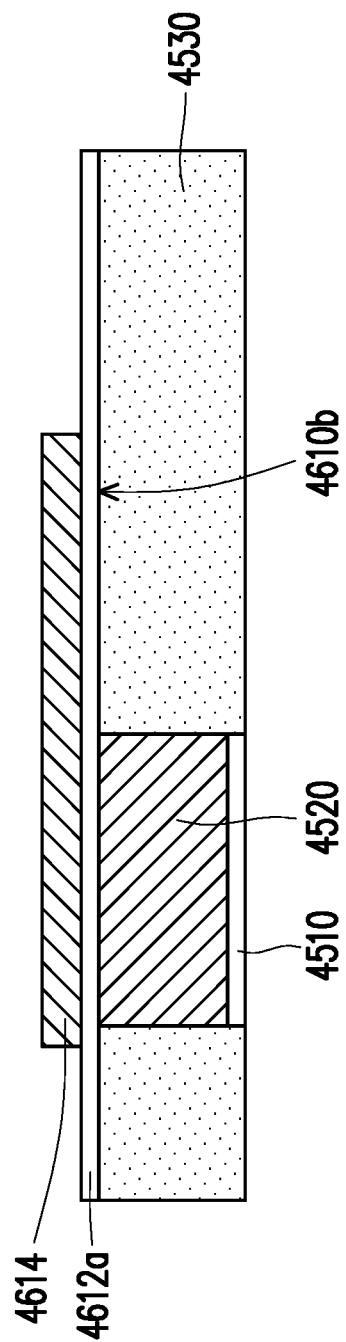
FIG. 6A to FIG. 6H are schematic cross-sectional views of structures formed during a manufacturing method of a semiconductor package in accordance with some embodiments of the disclosure.
Figure 6B:
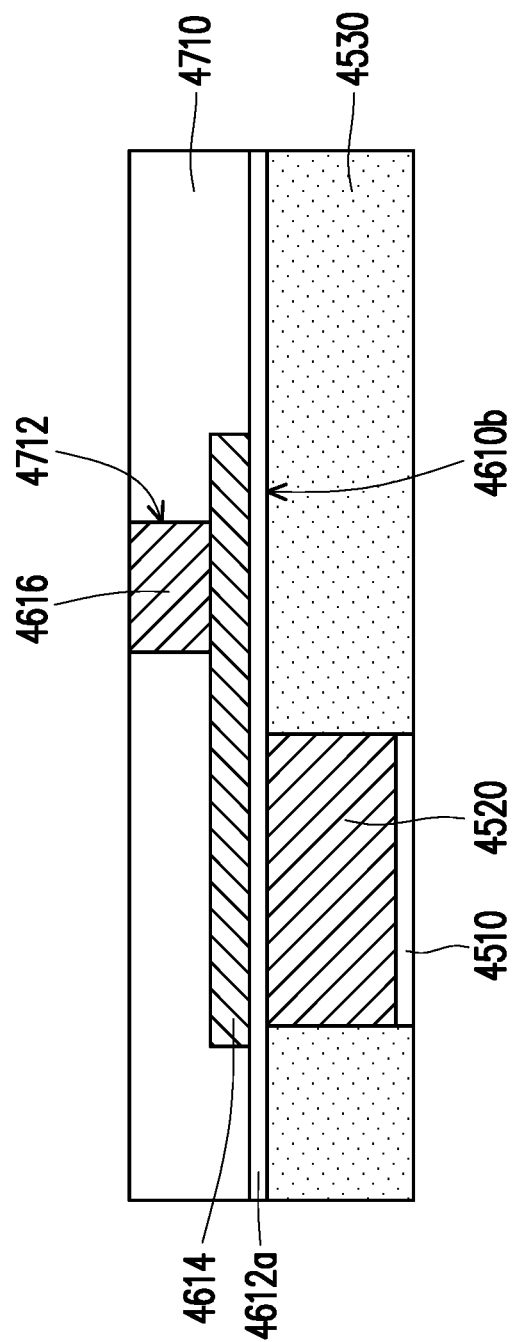

In FIG. 6B, an auxiliary mask 4710 is formed on the seed material layer 4612a embedding the conductive pads 4614. The auxiliary mask 4710 may be thicker than the conductive pads 4614, and include openings 4712 exposing at their bottom portions of the conductive pads 4614 extending over the high-modulus dielectric layer 4530. That is, the openings 4712 expose portions of the conductive pads 4614 not overlapping the through vias 4520. A conductive material is then formed in the openings 4712 of the auxiliary mask 4710, to form routing vias 4616, for example via plating. In some embodiments, the conductive pad 4614 may directly seed deposition of the conductive material of the routing vias 4616.

Figure 6C:
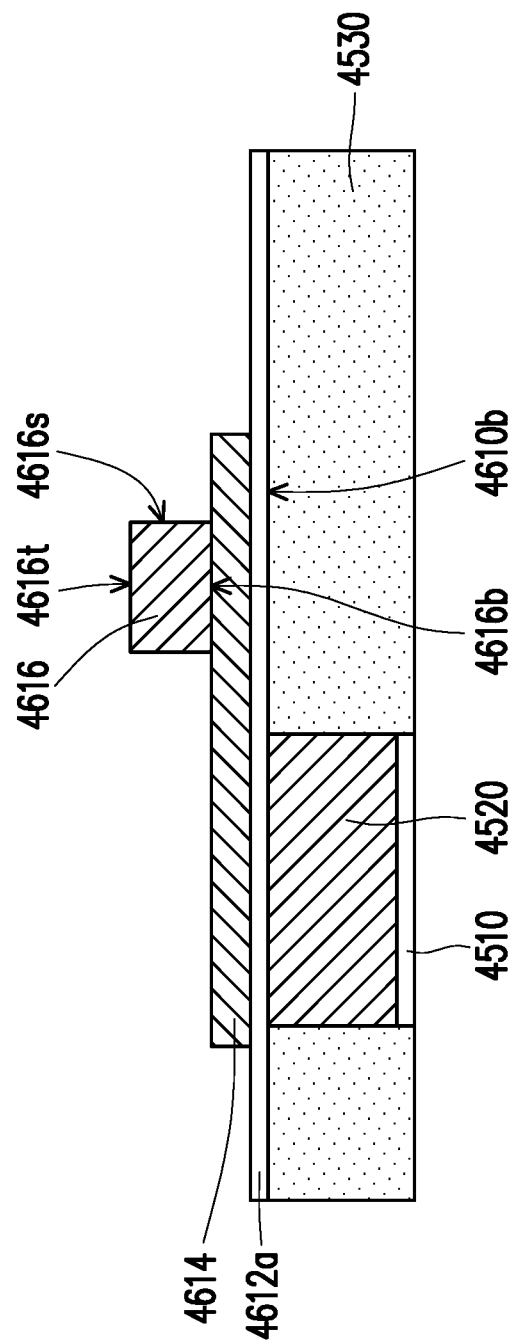
Figure 6D:
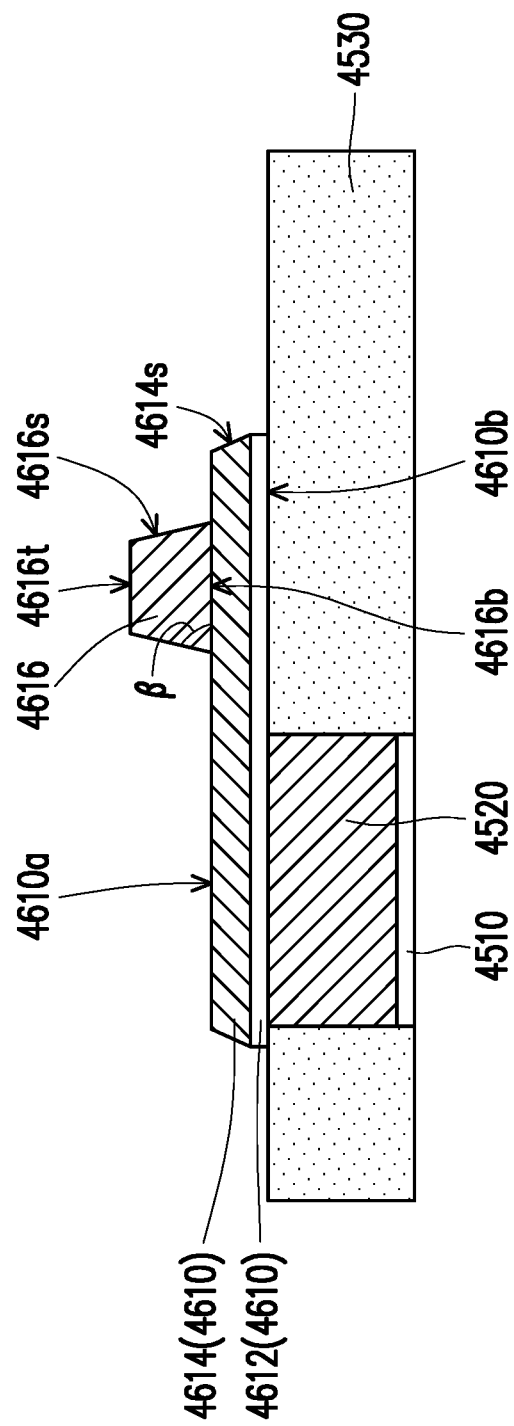

In FIG. 6C, the auxiliary mask 4710 is removed, for example via stripping or ashing. Upon removal of the auxiliary mask 4710, the conductive pads 4614 with the routing vias 4616 remain on the seed material layer 4612a. Referring to FIG. 6C and FIG. 6D, the portions of the seed material layer 4612a protruding with respect to the conductive pads 4614 may be removed, for example via wet etching, to leave extension pads 4610. The extension pads 4610 may include the seed layers 4612 and the conductive pads 4614, similarly to what was previously described for the extension pads 610 of FIG. 1K. The routing vias 4616 are disposed on ends 4610b of the extension pads 4610 overlying the high-modulus dielectric layer 4530, while the other ends 4610a of the extension pads 4610 overlie the through vias 4520 and the seed layers 4510. In some embodiments, the wet etching step performed to remove the excess portions of the seed material layer 4612a results in a tapered shape of the sidewalls 4616s of the routing vias 4616 with respect to the top surface 4616t and the bottom surface 4616b of the routing via 4616. In some embodiments, the tapering angle β between the sidewall 4616s and the bottom surface 4616b may be in the range from 70 degrees to 90 degrees. For example, the tapering angle β may be smaller than 90 degrees. The conductive pads 4614 may also have tapered sidewalls 4614s as a result of the wet etching, similar to what was just described for the routing vias 4616.

Figure 6E:
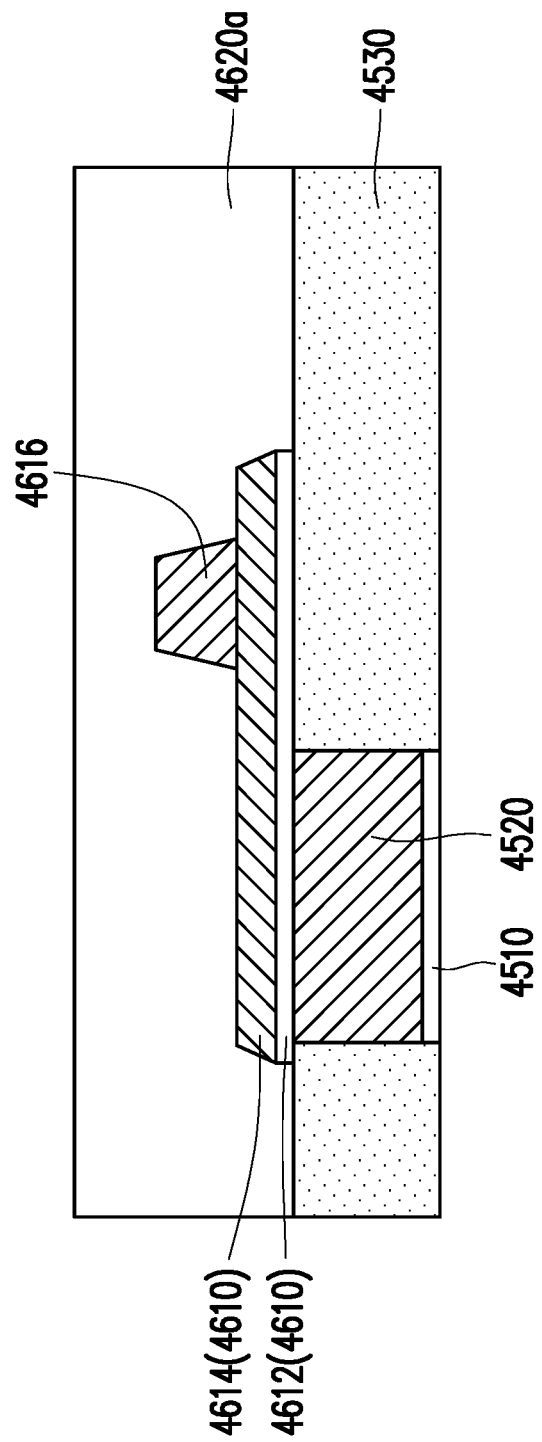

In some embodiments, a dielectric material layer 4620a is formed on the high-modulus dielectric layer 4530, embedding the extension pads 4610 and the routing vias 4616, as illustrated, e.g., in FIG. 6E. In some embodiments, the dielectric material layer 4620a includes polyimide, epoxy resin, acrylic resin, phenol resin, benzocyclobutene (BCB), polybenzooxazole (PBO), or any other suitable polymer-based dielectric material. In some embodiments, the dielectric material layer 4620a may be formed by suitable fabrication techniques such as spin-on coating, chemical vapor deposition (CVD), plasma-enhanced chemical vapor deposition (PECVD), or the like.

Figure 6F:
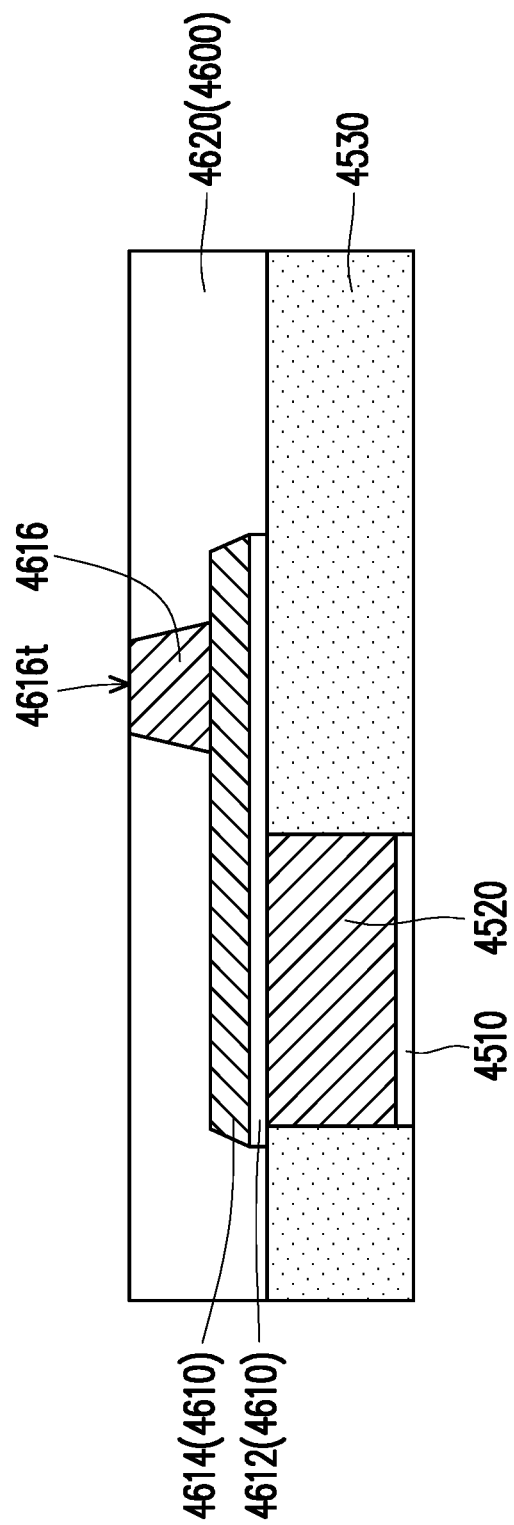
Figure 6G:
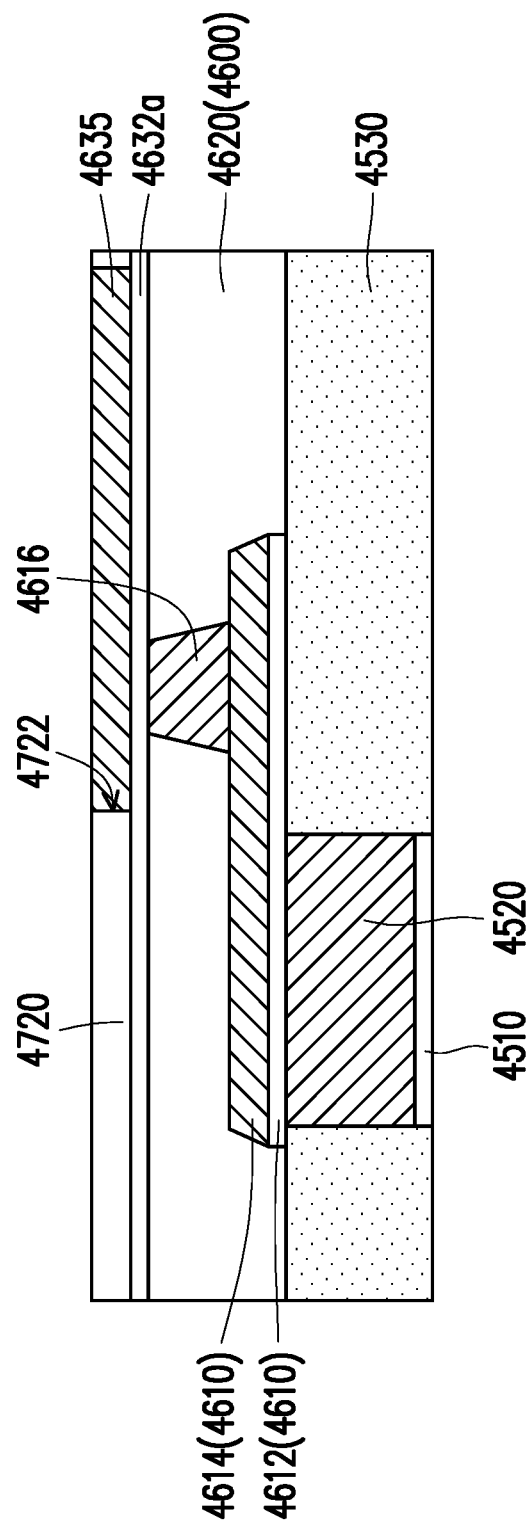

In some embodiments, a planarization process (e.g., CMP) may be performed to remove portions of the dielectric material layer 4620a until the top surfaces 4616t of the routing vias 4616 are exposed from the dielectric layer 4620, as illustrated, e.g., in FIG. 6F. Thereafter, a seed material layer 4632a may be blanketly formed over the dielectric layer 4620 and the routing vias 4616, as illustrated, e.g., in FIG. 6G. An auxiliary mask 4720 is formed on the seed material layer 4632a. The auxiliary mask 4710 includes openings 4722 exposing regions of the seed material layer 4632a overlying the routing vias 4616 and the high-modulus dielectric layer 4530. Materials and processes to form the auxiliary mask 4720 may be similar to the ones previously described for the auxiliary mask AM (illustrated, e.g., in FIG. 1D). A conductive material is disposed in the openings 4722 to form routing lines 4635. The auxiliary mask 4720 and the underlying portions of the seed material layer 4632a may then be removed, for example via ashing, stripping, etching, or a combination thereof, to leave the routing lines 4635 with the underlying seed layers 4632, as illustrated, e.g., in FIG. 6H. In such embodiments, the routing lines 4635 of the bottommost interconnection tier are formed in different process steps than the routing vias 4616, and seed layers 4632 are interposed between the routing lines 4635 and the routing vias 4616.

Figure 6H:
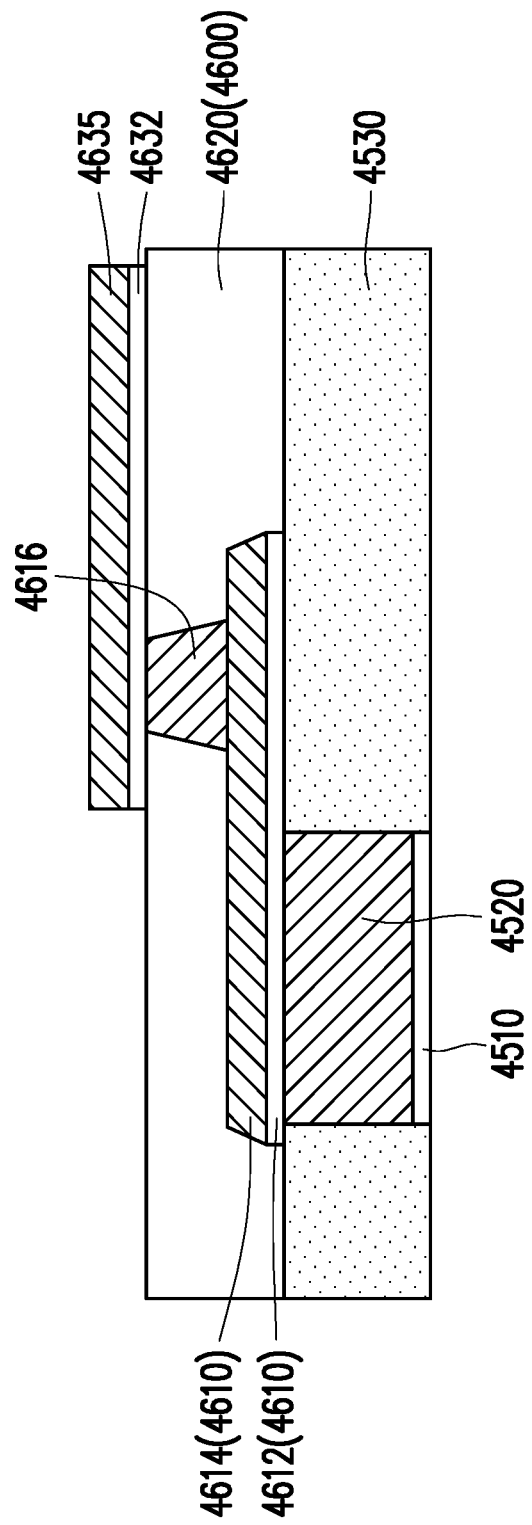
Figure 7:
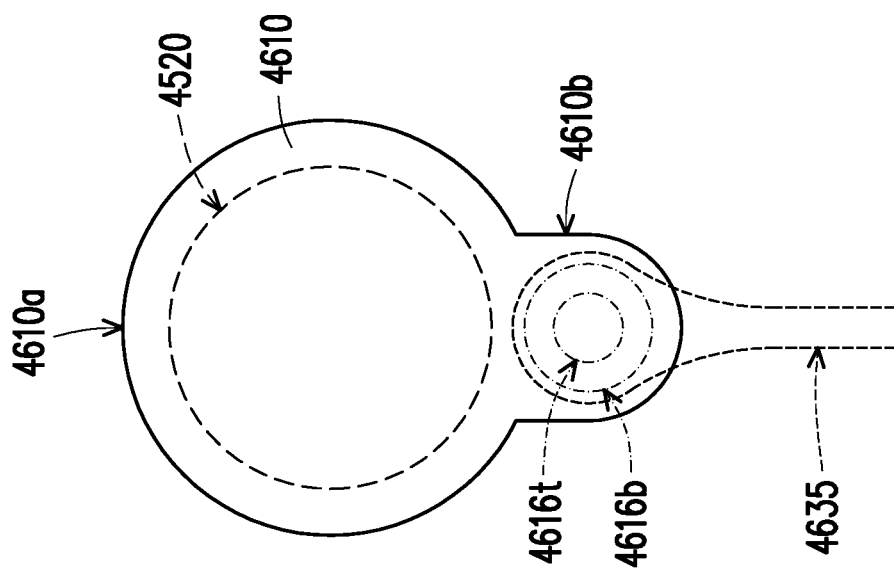
FIG. 7 is a schematic top view of the structure illustrated in FIG. 6E in accordance with some embodiments of the disclosure.

FIG. 7 is a schematic top view of the structure illustrated in FIG. 6H. In FIG. 7, the span of the through via 4520 underlying the extension pad 4610 is illustrated as a dashed line, the spans of the top surface 4616t and the bottom surface 4616b of the routing via 4616 are illustrated as dash-dotted lines, and the span of the routing line 4635 is illustrated as a dotted line. Referring to FIG. 6H and FIG. 7, the routing via 4616 lands on the end 4610b of the extension pad 4610. In some embodiments, both the top surface 4616t and the bottom surface 4616b of the routing via 4616 do not overlap with the through via 4520. That is, the routing via 4616 is formed at a distance from the through via 4520. In some embodiments, the end 4610b is narrower than the end 4610a overlying the through via 4520. In some embodiments, the routing line 4635 overlaps with the routing via 4616. However, the disclosure is not limited thereto. For example, the extension pad 4610 may have different shapes (as illustrated, e.g., in FIG. 4C). In some embodiments, one or both of the span of through vias 4520 and the span of the routing via 4616 may have different shapes than circular (e.g., elliptical, rectangular, square, other polygonal shapes, etc.).

FIG. 8A to FIG. 8E are schematic cross-sectional views of structures formed during manufacturing of a redistribution structure 5600 according to some embodiments of the disclosure. In some embodiments, the redistribution structure 5600 may be included in any one of the semiconductor packages of the disclosure (e.g., in place of the redistribution structure 600 of the semiconductor package 10 of FIG. 1P). In some embodiments, the structure illustrated in FIG. 8A may be obtained from the structure illustrated in FIG. 6C by removing the seed material layer 4612a via dry etching, to form extension pads 5610 including the seed layer 5612 and the conductive pad 5614, similarly to what was previously described for the extension pads 610 of FIG. 1K. The routing vias 5616 are formed on the ends 5610b of the extension pads 5610 overlying the high-modulus dielectric layer 5530, while the other ends 5610a of the extension pads 5610 overlie the through vias 5520 and the seed layers 5510. In some embodiment, the dry etching step results in a vertical shape of the sidewalls 5616s of the routing vias 5616 with respect to the top surfaces 5616t and the bottom surfaces 5616b of the routing vias 5616. In some embodiments, the angle γ between the sidewall 5616s and the bottom surface 5616b may be substantially equal to 90 degrees. The conductive pads 5614 may also have substantially straight sidewalls 5614s, as just described for the routing vias 5616.

Figure 8A:
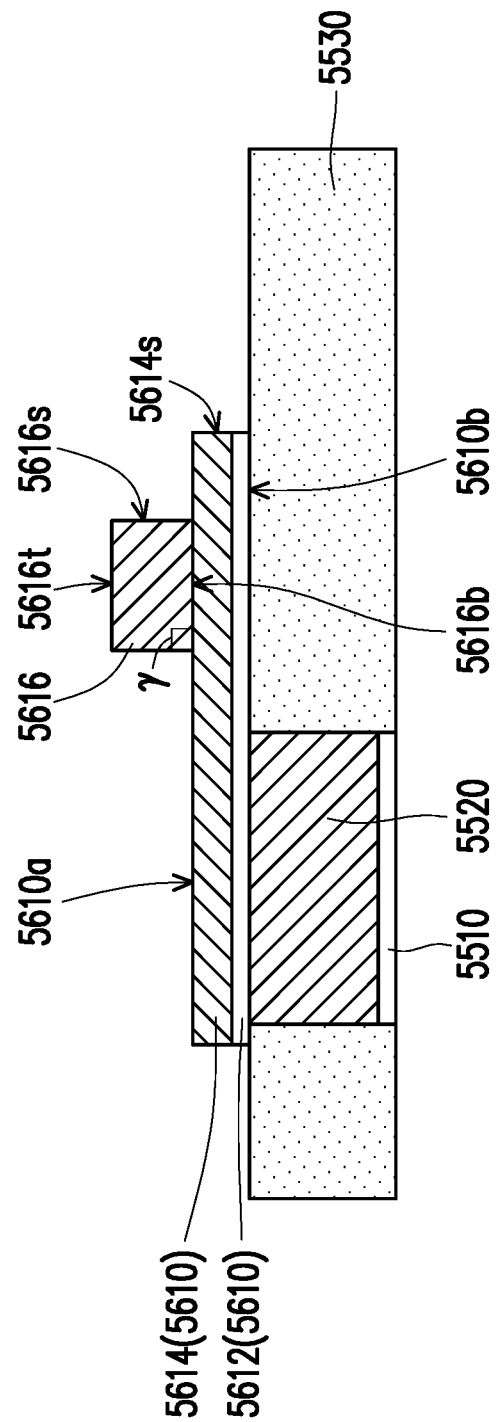
FIG. 8A to FIG. 8E are schematic cross-sectional views of structures formed during a manufacturing method of a semiconductor package in accordance with some embodiments of the disclosure.
Figure 8B:
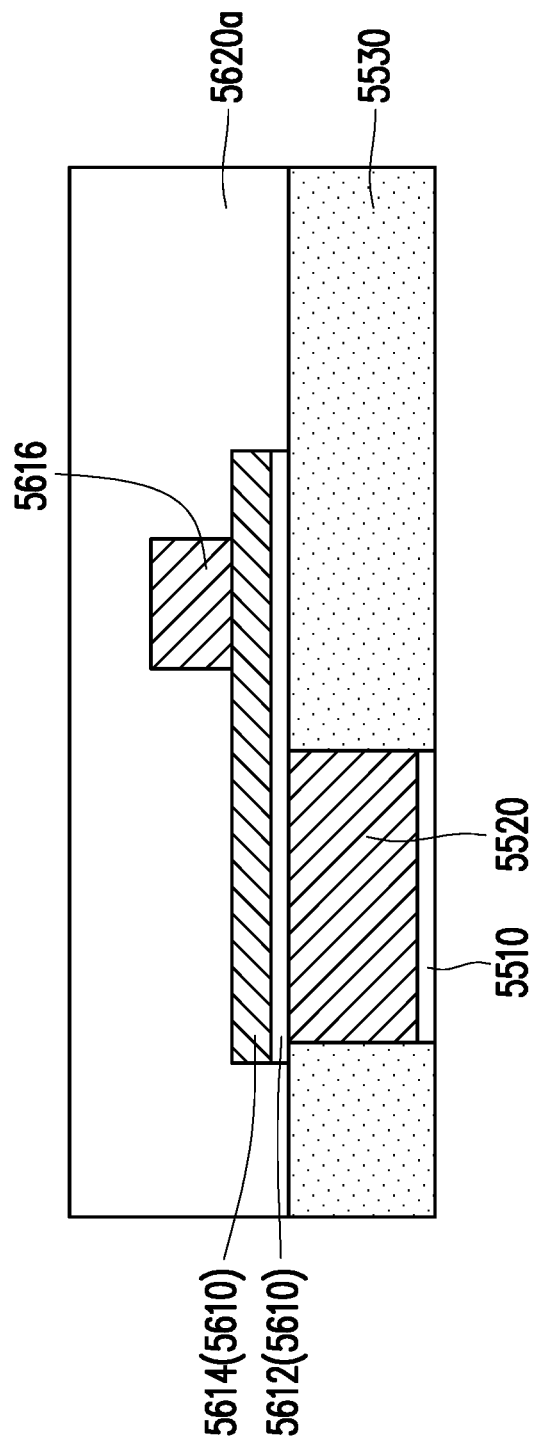
Figure 8C:
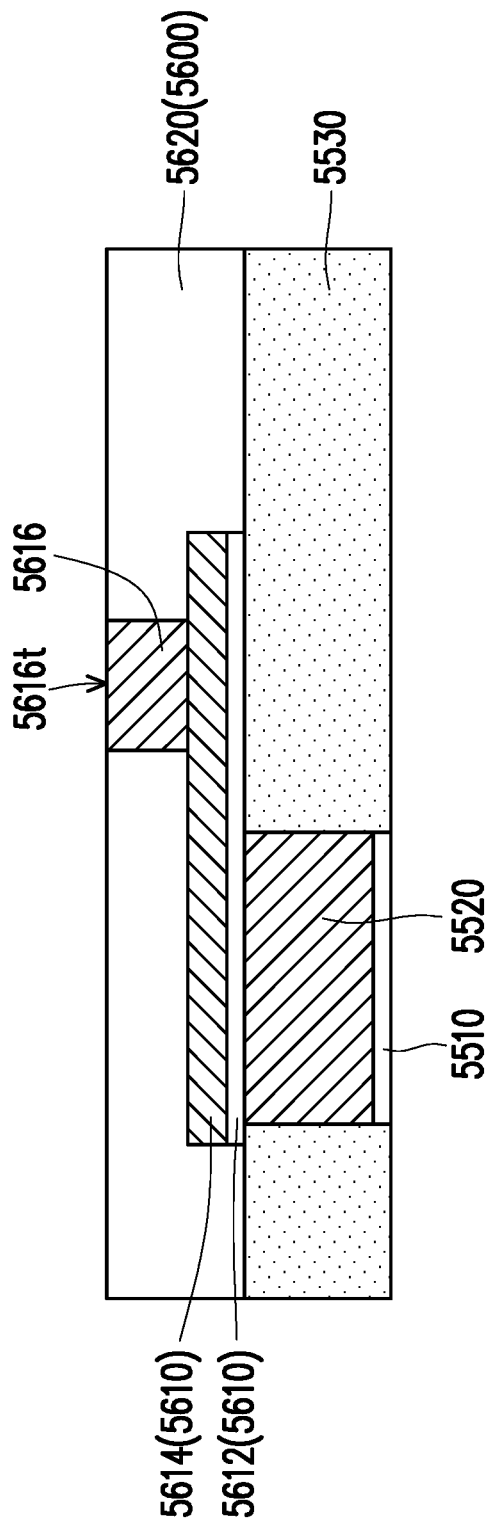
Figure 8D:
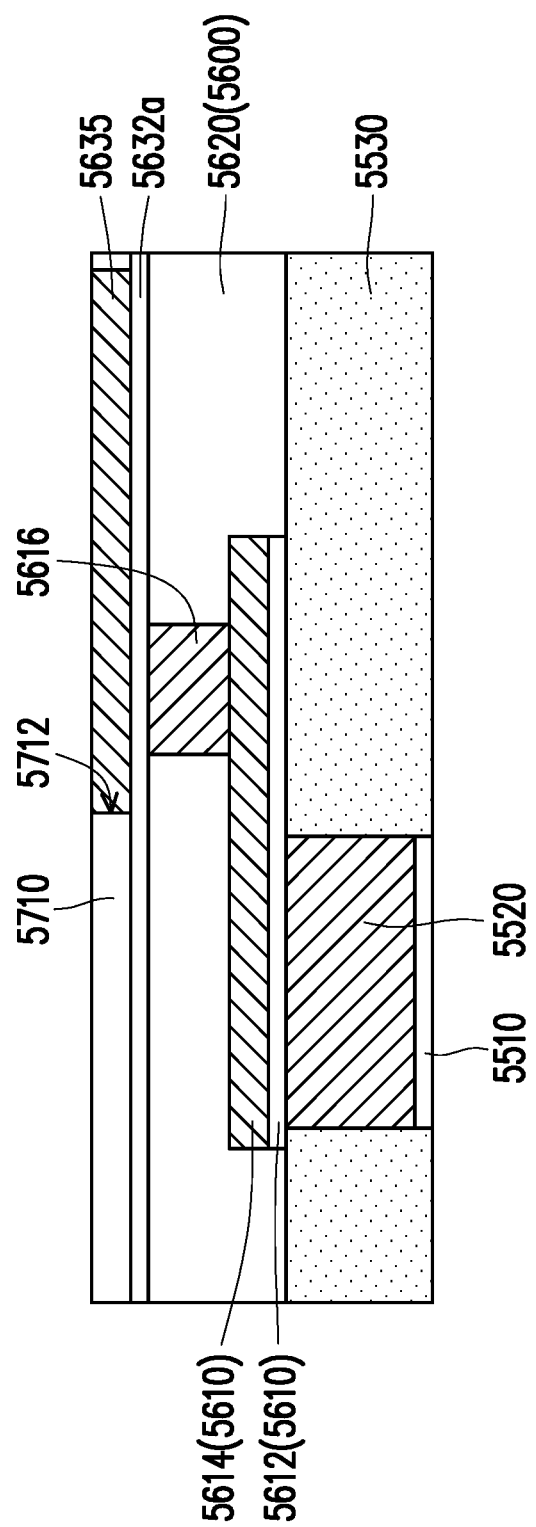

In some embodiments, process steps similar to the ones previously discussed with reference to FIG. 6E to FIG. 6H may be performed. Briefly, a dielectric material layer 5620a is formed on the high-modulus dielectric layer 5530, as illustrated in FIG. 8B. In some embodiments, the dielectric material layer 5620a may initially bury the extension pads 5610 and the routing vias 5616. A grinding process, a planarization process or the like may be performed to remove portions of the dielectric material layer 5620a until the top surfaces 5616t of the routing vias 5616 are exposed by the dielectric layer 5620, as illustrated, e.g., in FIG. 8C. Thereafter, a seed material layer 5632a may be blanketly formed over the dielectric layer 5620 and the routing vias 5616, as illustrated, e.g., in FIG. 8D. An auxiliary mask 5710 is formed on the seed material layer 5632a, including openings 5712 exposing regions of the seed material layer 5632a overlying the routing vias 5616 and the high-modulus dielectric layer 5530. A conductive material is disposed in the openings 5712 to form routing lines 5635. The auxiliary mask 5710 and the underlying portions of the seed material layer 5632a may then be removed, for example via ashing, stripping, etching, or a combination thereof, to leave the routing lines 5635 with the underlying seed layers 5632, as illustrated, e.g., in FIG. 8E.

Figure 8E:
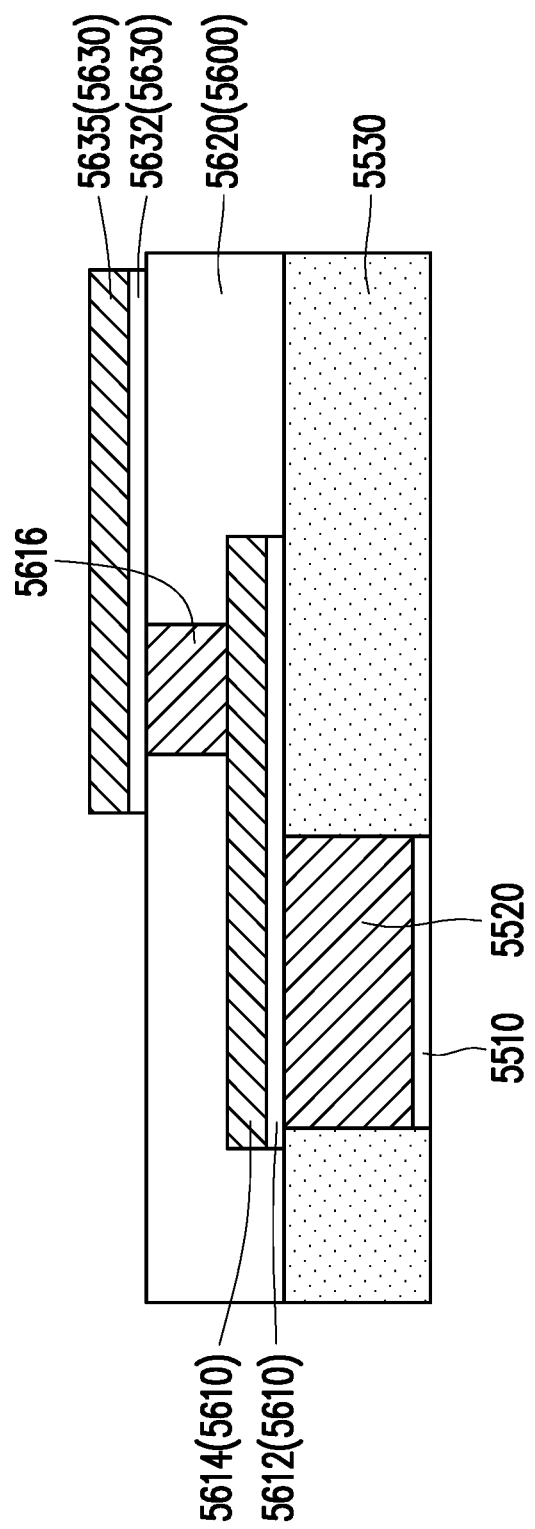
Figure 9:
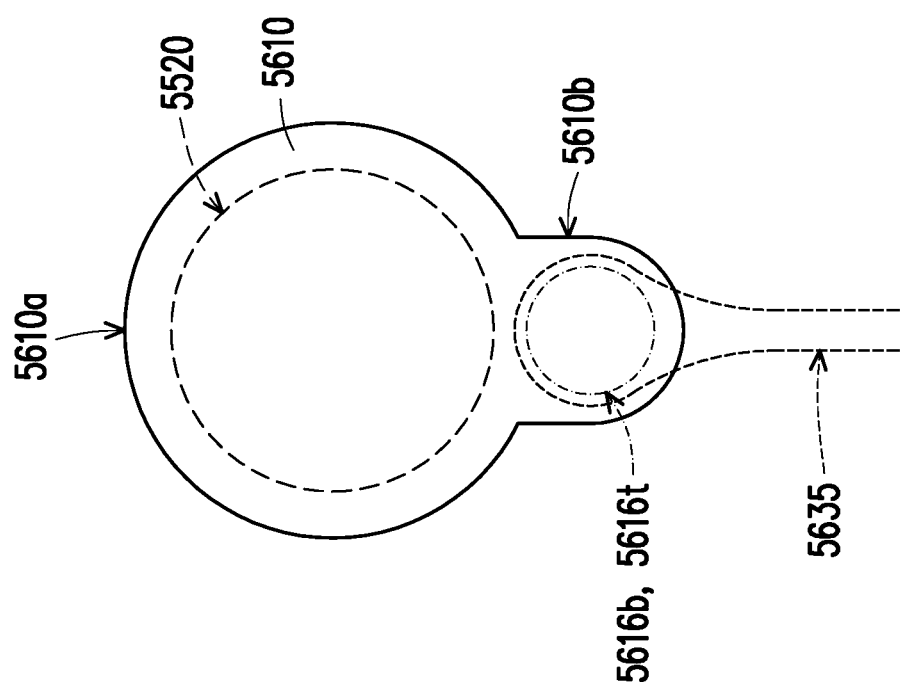
FIG. 9 is a schematic top view of the structure illustrated in FIG. 8E in accordance with some embodiments of the disclosure.
Figure 10:
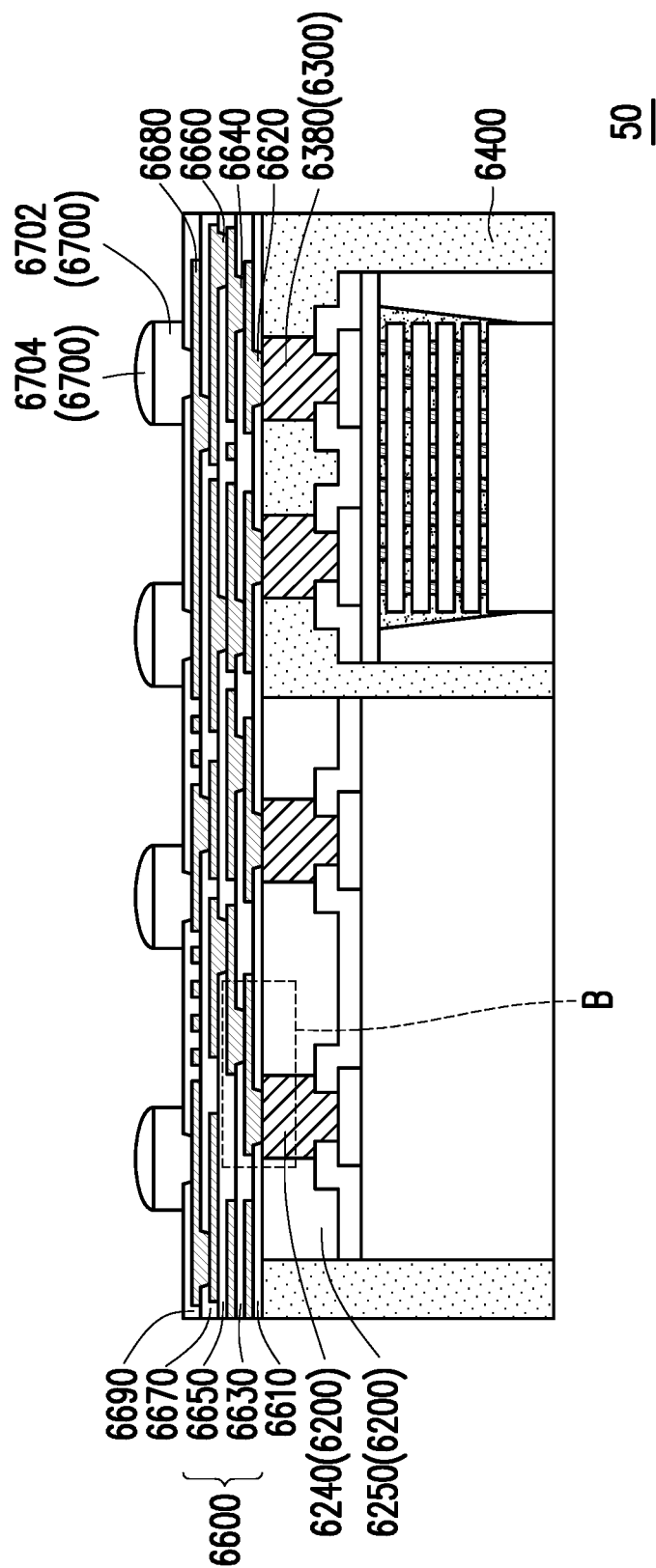

FIG. 9 is a schematic top view of the structure illustrated in FIG. 8E. In FIG. 9, the span of the through via 5520 underlying the extension pad 5610 is illustrated as a dashed line, the spans of the top surface 5616t and the bottom surface 5616b of the routing via 5616 are illustrated as dash-dotted lines, and the span of the routing line 5635 is illustrated as a dotted line. Referring to FIG. 8E and FIG. 9, the routing via 5616 lands on the end 5610b of the extension pad 5610. In some embodiments, both the top surface 5616t and the bottom surface 5616b of the routing via 5616 do not overlap with the through via 5520. That is, the routing via 5616 is formed at a distance from the through via 5520. In some embodiments, the end 5610b is narrower than the end 5610a overlying the through via 5520. In some embodiments, the routing line 5635 overlaps with the routing via 5616. However, the disclosure is not limited thereto. For example, the extension pad 5610 may have different shapes (as illustrated, e.g., in FIG. 4C). In some embodiments, one or both of the span of through vias 5520 and the span of the routing via 5616 may have different shapes than circular (e.g., elliptical, rectangular, square, other polygonal shapes, etc.).

Figure 10:
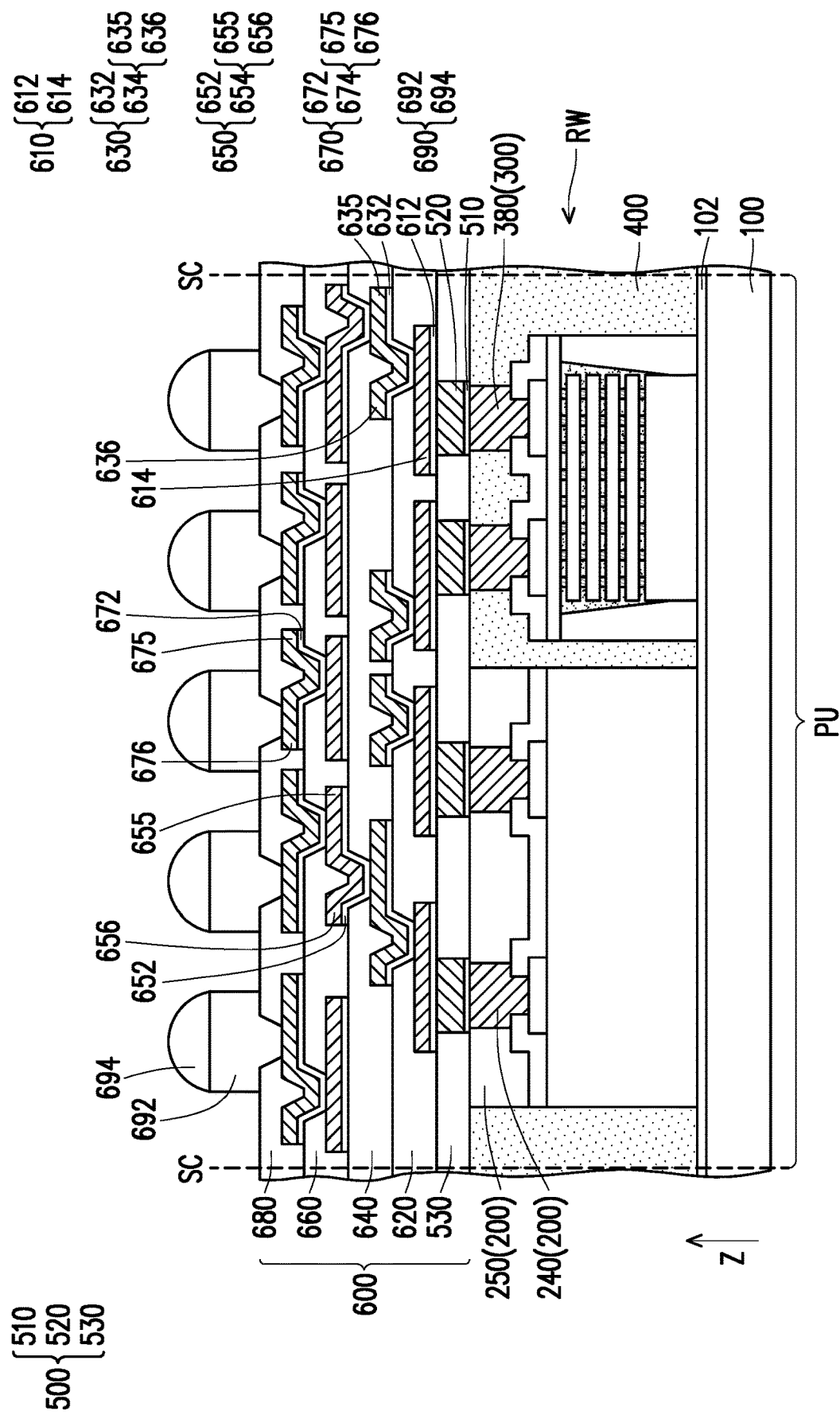
FIG. 10 is a schematic cross-sectional view of a semiconductor package in accordance with some embodiments of the disclosure.
Figure 11:
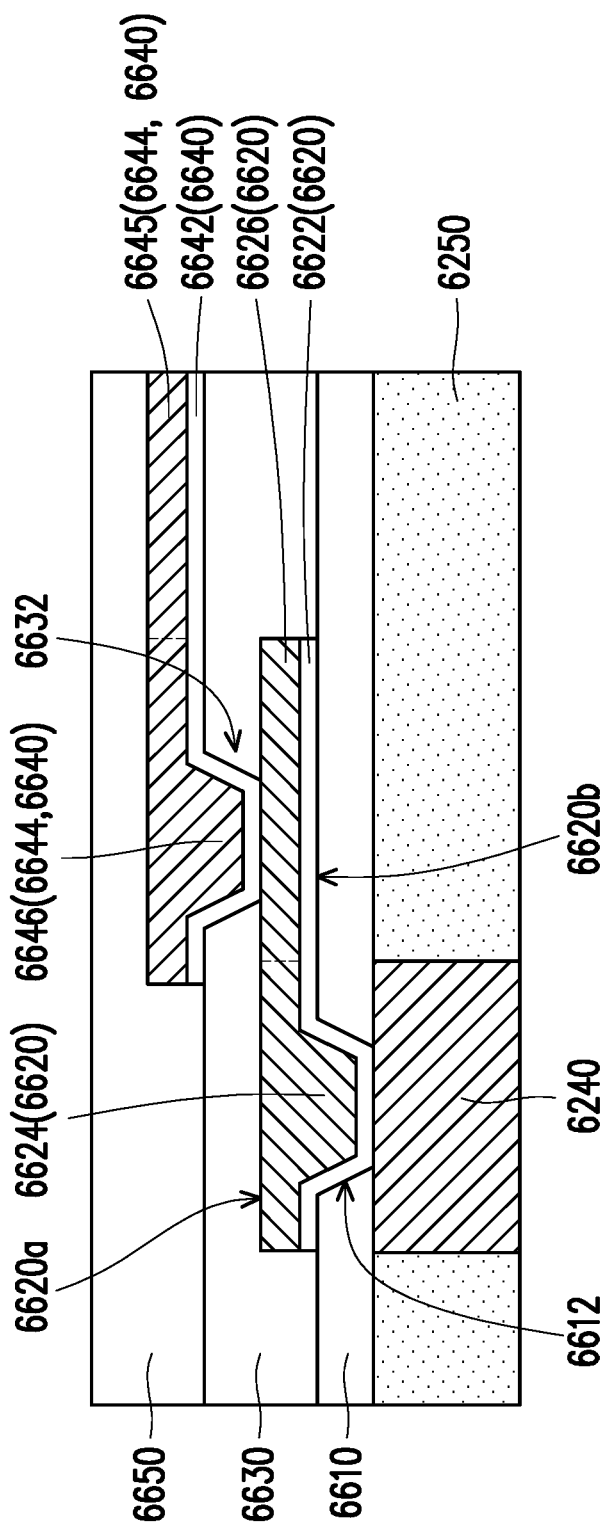
FIG. 11 is a schematic cross-sectional view of a portion of a semiconductor package in accordance with some embodiments of the disclosure.
Figure 12:
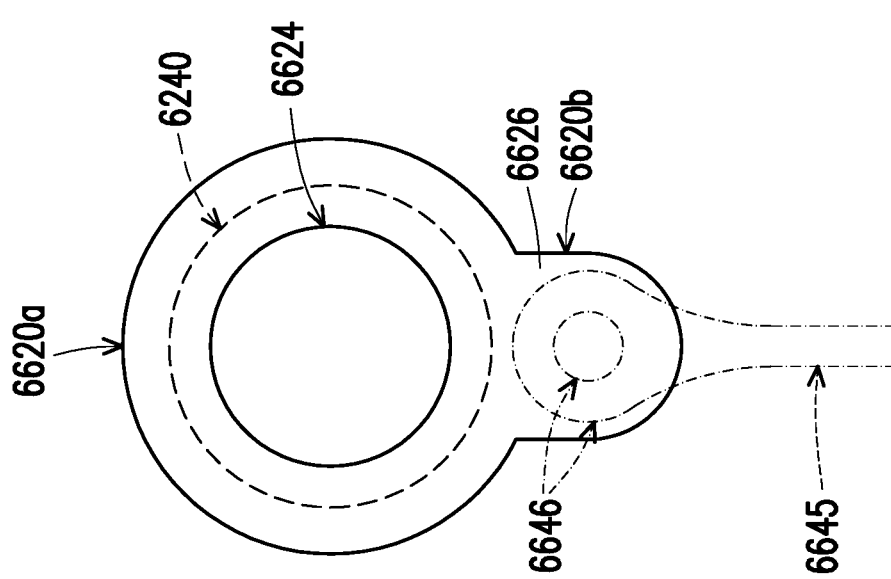
FIG. 12 is a schematic top view of the structure illustrated in FIG. 11 in accordance with some embodiments of the disclosure.

FIG. 10 is a schematic cross-sectional view of a semiconductor package 50 according to some embodiments of the disclosure. FIG. 11 is a schematic cross-sectional view of the area B of the semiconductor package 50 illustrated in FIG. 10. FIG. 12 is a schematic top view of the structure illustrated in FIG. 11. Referring to FIG. 10 to FIG. 12, in some embodiments, the semiconductor package 50 may have a similar structure and be fabricated following similar processes as previously described for the semiconductor package 10 of FIG. 1P, the semiconductor package 20 of FIG. 4A, the semiconductor package 30 of FIG. 4C or the semiconductor package 40 of FIG. 5. Briefly, the semiconductor package 50 includes the semiconductor dies 6200, 6300 encapsulated by the encapsulant 6400. A difference between the semiconductor package 50 and the semiconductor packages described above, lies in that the semiconductor package 50 does not include a high-modulus dielectric layer (e.g., like the high-modulus dielectric layer 530 of FIG. 1P). Rather, the dielectric layer 6610 of the elevation tier of the redistribution structure 6600 includes the same material as the other dielectric layers 6630, 6650, 6670, 6690. More in detail, the bottommost tier of the redistribution structure 6600 may be an elevation tier, having disposed thereon dielectric layers 6630, 6650, 6670, 6690 and interconnection patterns 6640, 6660, 6680 alternately stacked. Connective terminals 6700 may be formed on the topmost dielectric layer 6690. The connective terminals 6700 may be similar to the connective terminals 700 of FIG. 1P, and may include, for example, under-bump metallurgies 6702 and solder caps 6704.

In some embodiments, the bottommost dielectric layer 6610 include openings 6612 exposing the contact posts 6240, 6380 of the semiconductor dies 6200, 6300. Extension patterns 6620 are formed on the bottommost dielectric layer 6610. The extension patterns 6620 may include a seed layer 6622, an elevation via 6624 and a conductive pad 6626. The seed layers 6622 are conformally disposed on the dielectric layer 6610, contacting the contact posts 6240 at the bottom of the openings 6612. The elevation vias 6624 may be disposed on the seed layer 6622 in the openings 6612. In some embodiments, the elevation vias 6624 fill the openings 6612. The conductive pads 6626 extend on the seed layer 6622, on the elevation vias 6624, and over the protective layer 6250 or the encapsulant 6400. In some embodiments, the conductive pads 6626 and the elevation vias 6624 are formed as a single piece, for example during a same plating step. As illustrated in FIG. 12, the extension patterns 6620 may have a similar shape to the extension pads (e.g., the extension pads 610 of FIG. 3B), including a wider end 6620a overlying the contact posts 6240, 6380 and a narrower end 6620b overlying the protective layer 6250 or the encapsulant 6400. In FIG. 12, the span of the contact post 6240 is illustrated as a dashed line and the span of the contact surface of the elevation via 6624 with the contact post 6240 is illustrated as a solid line. In some embodiments, the interconnection patterns 6640 of the next tier of the redistribution structure 6600 (e.g., the bottommost interconnection tier) contact the end 6620b of the extension patterns 6620 extending over the protective layer 6250 or the encapsulant 6400. For example, the interconnection patterns 6640 include conductive traces 6644 and, optionally, a seed layer 6642. The conductive traces 6644 include, in turn, routing lines 6645 and routing vias 6646. The routing vias 6646 connect the extension patterns 6620 to the routing lines 6645 by landing on the narrower end 6620b of the extension patterns, at a distance from the elevation vias 6624. In FIG. 12, the span of the conductive traces 6644 is illustrated as dash-dotted line. Similar to what was previously discussed, the conductive traces 6644 may be formed so as to avoid overlap between the routing vias 6646 with respect to the elevation vias 6624 and the underlying contact post 6240. By doing so, the redistribution structure 6600 may efficiently dissipate mechanical stress generated during use or manufacturing of the semiconductor package 50. In FIG. 12, the extension pattern 6620 was illustrated with a similar configuration to the extension pads 610 of FIG. 3C, however, the disclosure is not limited thereto. In some alternative embodiments, the two ends 6620a, 6620b of the extension pattern 6620 may have comparable width. Furthermore, the elevation via 6624 and the routing via 6646 are not limited to have the tapered shape illustrated in FIG. 11. For example, in some alternative embodiments, the elevation via 6624 and/or the routing via 6646 may be formed according to the processes previously described in FIG. 6A to FIG. 6G or FIG. 8A to FIG. 8E, thus resulting in a change in the tapering direction, or in vertical sidewalls.

In accordance with some embodiments of the disclosure, a semiconductor package includes a semiconductor die, an encapsulant, a first dielectric layer, a through via, an extension pad, a second dielectric layer, and a routing via. The semiconductor die includes a contact post. The first dielectric layer extends on the encapsulant and the semiconductor die. The through via extends through the first dielectric layer and has one end contacting the contact post of the semiconductor die. The extension pad is disposed on the first dielectric layer, and contacts an opposite end of the through via with respect to the contact post. The extension pad has an elongated shape, a first end of the extension pad overlaps with the contact post and the through via, and a second end of the extension pad overlaps with the encapsulant. The second dielectric layer is disposed on the first dielectric layer and the extension pad. The routing via extends through the second dielectric layer to contact the second end of the extension pad.

In accordance with some embodiments of the disclosure, a semiconductor package includes semiconductor dies, an encapsulant, and a redistribution structure. The semiconductor dies include conductive posts. The encapsulant wraps the semiconductor dies while leaving exposed top surfaces of the conductive posts. The redistribution structure includes an elevation tier, elongated pads, and alternately stacked interconnection dielectric layers and interconnection patterns. The elevation tier is disposed directly on the encapsulant and includes an elevation dielectric layer and elevation vias. The elevation dielectric layer extends on the encapsulant and the semiconductor dies. The elevation vias extend through the elevation dielectric layer and have one end in physical contact with the conductive posts of the semiconductor dies. The elongated pads are disposed on the elevation dielectric layer and are connected to a corresponding one elevation via of the elevation vias. The elongated pads have one end in physical contact with the corresponding elevation via and another end extending on the elevation dielectric layer. The interconnection dielectric layers and interconnection patterns are alternately stacked, and are disposed on the elevation tier and the elongated pads. The interconnection patterns include routing vias extending through the interconnection dielectric layers and routing lines connected to the routing vias and lying on the interconnection dielectric layers. A first interconnection dielectric layer of the interconnection dielectric layers lies directly on the elevation dielectric layer. First routing vias of the routing vias extend through the first interconnection dielectric layer and land the other ends of the elongated pads at a distance from the elevation vias.

In accordance with some embodiments of the disclosure, a manufacturing method of a semiconductor package includes at least the following steps. Semiconductor dies are encapsulated in an encapsulant. The semiconductor dies have contact posts exposed at a level height of a top surface of the encapsulant. An elevation dielectric layer is formed on the encapsulated semiconductor dies. A first conductive material is disposed on the contact posts of the encapsulated semiconductor dies to form elevation vias. A second conductive material is disposed on the elevation dielectric layer to form conductive pads electrically connected to the elevation vias. A first terminus of the conductive pads is in contact with the elevation vias and a second terminus of the conductive pads extends on the elevation dielectric layer. A third conductive material is disposed on the second termini of the conductive pads to form routing vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a semiconductor die, comprising a contact post;
an encapsulant, encapsulating the semiconductor die;
a first dielectric layer, extending on the encapsulant and the semiconductor die;
a through via, extending through the first dielectric layer and having one end contacting the contact post of the semiconductor die;
an extension pad disposed on the first dielectric layer and contacting an opposite end of the through via with respect to the contact post, wherein the extension pad has an elongated shape, a first end of the extension pad overlaps with the contact post and the through via, and a second end of the extension pad overlaps with the encapsulant;
a second dielectric layer, disposed on the first dielectric layer and the extension pad; and
a routing via, extending through the second dielectric layer to contact the second end of the extension pad.

2. The semiconductor package of claim 1, wherein the first dielectric layer includes a first material, the second dielectric layer includes a second material, and an elastic modulus of the first material is higher than an elastic modulus of the second material.

3. The semiconductor package of claim 2, wherein the encapsulant is made of a third material, and an elastic modulus of the third material is higher than an elastic modulus of the second material.

4. The semiconductor package of claim 1, wherein a ratio of the elastic modulus of the second material to the elastic modulus of the first material is in the range from 0.5 to 3.

5. The semiconductor package of claim 1, wherein an overlap between the routing via and the through via is null.

6. The semiconductor package of claim 1, wherein the extension pad includes a seed layer and a conductive pad stacked on the seed layer, and the seed layer contacts the through via on one side and the conductive pad on an opposite side.

7. The semiconductor package of claim 1, wherein the routing via has tapered sidewalls.

8. The semiconductor package of claim 7, wherein a tapering angle of the routing via is greater than 90 degrees.

9. A semiconductor package, comprising:
semiconductor dies, comprising conductive posts;
an encapsulant, wrapping the semiconductor dies while leaving exposed top surfaces of the conductive posts; and
a redistribution structure, comprising:
an elevation tier, disposed directly on the encapsulant and comprising an elevation dielectric layer and elevation vias, wherein the elevation dielectric layer extends on the encapsulant and the semiconductor dies, the elevation vias extend through the elevation dielectric layer, and the elevation vias have one end in physical contact with the conductive posts of the semiconductor dies;
elongated pads disposed on the elevation dielectric layer and connected to a corresponding one elevation via of the elevation vias, wherein the elongated pads have one end in physical contact with the corresponding elevation via and another end extending on the elevation dielectric layer; and
alternately stacked interconnection dielectric layers and interconnection patterns disposed on the elevation tier and the elongated pads, wherein the interconnection patterns comprise routing vias extending through the interconnection dielectric layers and routing lines connected to the routing vias and lying on the interconnection dielectric layers, a first interconnection dielectric layer of the interconnection dielectric layers lies directly on the elevation dielectric layer, and first routing vias of the routing vias extending through the first interconnection dielectric layer land on the other ends of the elongated pads at a distance from the elevation vias.

10. The semiconductor package of claim 9, wherein the elongated pads and the corresponding elevation vias are integrally formed.

11. The semiconductor package of claim 9, wherein the elongation vias comprise through vias stacked on corresponding first seed layers, the elongated pads comprise conductive pads disposed on corresponding second seed layers, and the second seed layers are disposed between the through vias and the conductive pads.

12. The semiconductor package of claim 9, wherein the ends of the elongated pads in physical contact with the elevation vias are wider than the other ends of the elongated pads extending on the elevation dielectric layer.

13. The semiconductor package of claim 9, wherein the conductive posts of the semiconductor dies are encircled by at least one selected from the encapsulant and a protective dielectric layer, and the first routing vias overlap with at least one selected from the encapsulant and the protective dielectric layer.

14. The semiconductor package of claim 9, wherein first routing lines of the routing lines extend on the first interconnection dielectric layer, the first routing lines are connected to and extend on the first routing vias, and the redistribution structure further comprises first seed layers interposed between the first routing lines and the first routing vias.

15. A manufacturing method of a semiconductor package, comprising:
    encapsulating semiconductor dies in an encapsulant, wherein the semiconductor dies have contact posts exposed at a level height of a top surface of the encapsulant;
    forming an elevation dielectric layer on the encapsulated semiconductor dies;
    disposing a first conductive material on the contact posts of the encapsulated semiconductor dies to form elevation vias;
    disposing a second conductive material on the elevation dielectric layer to form conductive pads electrically connected to the elevation vias, wherein a first terminus of the conductive pads is in contact with the elevation vias and a second terminus of the conductive pads extends on the elevation dielectric layer; and
    disposing a third conductive material on the second termini of the conductive pads to form routing vias.

16. The manufacturing method of claim 15, wherein forming the elevation dielectric layer comprises:
    laminating a dielectric layer on the encapsulated semiconductor dies and the elevation vias; and
    grinding the dielectric layer until top surfaces of the elevation vias are exposed.

17. The manufacturing method of claim 15, further comprising:
    providing an auxiliary mask on the encapsulated semiconductor dies, wherein the auxiliary mask includes openings exposing the contact posts of the semiconductor dies and wherein the first conductive material is disposed in the openings of the auxiliary mask.

18. The manufacturing method of claim 15, wherein forming the conductive pads further comprises providing an auxiliary mask on the elevation dielectric layer, wherein the auxiliary mask includes openings exposing at their bottom the elevation vias and region of the elevation dielectric layer extending on at least one selected from the encapsulant and a protective dielectric layer of the semiconductor dies, and the second conductive material is disposed in the openings of the auxiliary mask.

19. The manufacturing method of claim 15, wherein forming the routing vias further comprises forming an interconnection dielectric layer on the elevation dielectric layer, wherein the interconnection dielectric layer includes openings exposing the second termini of the conductive pads and the third conductive material is disposed in the openings of the interconnection dielectric layer.

20. The manufacturing method of claim 15, further comprising:
    embedding the routing vias and the conductive pads in a dielectric material layer; and
    planarizing the dielectric material layer to remove portions of the dielectric material layer until top surfaces of the routing vias are exposed.

* * * * *